US012219719B2

(12) United States Patent
Kim et al.

(10) Patent No.: US 12,219,719 B2
(45) Date of Patent: Feb. 4, 2025

(54) ELECTRONIC DEVICE INCLUDING FLEXIBLE DISPLAY

(71) Applicant: SAMSUNG ELECTRONICS CO., LTD., Suwon-si (KR)

(72) Inventors: Junhyuk Kim, Suwon-si (KR); Yeonggyu Yoon, Suwon-si (KR); Hyunggwang Kang, Suwon-si (KR); Moonsun Kim, Suwon-si (KR); Hoyoung Jeong, Suwon-si (KR); Hyoungtak Cho, Suwon-si (KR); Junghyeob Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 114 days.

(21) Appl. No.: 18/093,660

(22) Filed: Jan. 5, 2023

(65) Prior Publication Data

US 2023/0320005 A1    Oct. 5, 2023

Related U.S. Application Data

(63) Continuation of application No. PCT/KR2022/021210, filed on Dec. 23, 2022.

(30) Foreign Application Priority Data

Apr. 1, 2022  (KR) .......................... 10-2022-0041207
Jul. 13, 2022  (KR) .......................... 10-2022-0086591

(51) Int. Cl.
*H05K 5/02*    (2006.01)
*H05K 5/00*    (2006.01)

(52) U.S. Cl.
CPC ......... *H05K 5/0217* (2013.01); *H05K 5/0086* (2013.01)

(58) Field of Classification Search
CPC .......................... H05K 5/0217; H05K 5/0086
(Continued)

(56) References Cited

U.S. PATENT DOCUMENTS 10,537,026 B2    1/2020  Shin et al.
10,747,269 B1    8/2020  Choi et al.
(Continued)

FOREIGN PATENT DOCUMENTS

CN      113422858 A    9/2021
EP      3 974 940      3/2022
(Continued)

OTHER PUBLICATIONS

International Search Report dated Mar. 27, 2023 for PCT/KR2022/021210.
PCT Written Opinion dated Mar. 27, 2023 for PCT/KR2022/021210.

*Primary Examiner* — Timothy J Thompson
*Assistant Examiner* — Michael F McAllister
(74) *Attorney, Agent, or Firm* — Nixon & Vanderhye P.C.

(57) ABSTRACT

An electronic device may include: a first housing; a second housing disposed movably with respect to the first housing; a display disposed on the second housing and expanded or contracted as the second housing moves; a motor; a pinion gear disposed in the first housing and rotatable by receiving driving force from the motor; a rack gear disposed in the second housing, engaged with the at least one pinion gear and movable by the rotation of the at least one pinion gear; a switching structure disposed between the motor and the pinion gear, and changeable to a gear-connected state, or a gear-released state, an actuator disposed in the first housing, configured to change a state of the switching structure; and at least one processor operably coupled to the motor and the actuator, and the processor may be configured to change the (Continued)

switching structure to the gear-connected state or the gear-released state through the actuator based on identifying the designated event.

20 Claims, 25 Drawing Sheets

(58) Field of Classification Search
USPC .......................................................... 361/807
See application file for complete search history.

(56) References Cited

U.S. PATENT DOCUMENTS

| | | | |
|---|---|---|---|
| 11,003,207 B2 | 5/2021 | Kim et al. | |
| 11,551,585 B2* | 1/2023 | Liu | ........................ G06F 1/1624 |
| 2019/0253543 A1* | 8/2019 | Fan | ..................... H04M 1/0266 |
| 2020/0358887 A1 | 11/2020 | Lee et al. | |
| 2021/0124625 A1 | 4/2021 | Noh et al. | |
| 2022/0124188 A1 | 4/2022 | Song et al. | |
| 2022/0174829 A1* | 6/2022 | Choi | ..................... G06F 1/1637 |
| 2022/0183167 A1* | 6/2022 | Liu | ........................ G06F 1/1624 |
| 2022/0232716 A1* | 7/2022 | Lim | ..................... H05K 5/0017 |
| 2023/0075243 A1* | 3/2023 | Song | ..................... G06F 1/1624 |
| 2023/0189460 A1* | 6/2023 | Shin | ..................... H05K 5/0217 |
| | | | 361/807 |

FOREIGN PATENT DOCUMENTS

| | | |
|---|---|---|
| KR | 10-2011-0082943 A | 7/2011 |
| KR | 10-2020-0129645 A | 11/2020 |
| KR | 10-2021-0118850 A | 10/2021 |
| KR | 10-2021-0148396 A | 12/2021 |
| WO | 2020/166766 | 8/2020 |
| WO | 2021/049785 | 3/2021 |
| WO | 2021/121097 | 6/2021 |

\* cited by examiner

ELECTRONIC DEVICE INCLUDING FLEXIBLE DISPLAY

CROSS-REFERENCE TO RELATED APPLICATIONS

This application is a continuation of International Application No. PCT/KR2022/021210, filed on Dec. 23, 2022, designating the U.S., in the Korean Intellectual Property Receiving Office, and claiming priority to 10-2022-0041207 filed on Apr. 1, 2022, and Korean patent application number 10-2022-0086591 filed on Jul. 13, 2022, the disclosures of which are all hereby incorporated by reference herein in their entireties.

BACKGROUND

Field

Various embodiments relate to an electronic device including a flexible display.

Description of Related Art

In order for the user to easily carry an electronic device, an electronic device may be miniaturized. Although the electronic device is miniaturized, there is an increasing need for an electronic device in which the size of a display for displaying content can be changed so that a user can receive various contents through the electronic device. For example, the electronic device may include a flexible display in which the size of the display exposed to the outside of the electronic device can be changed.

SUMMARY

A housing of an electronic device may expand or contract a display by moving. The electronic device may include a driving part including various components for moving the housing. As the electronic device is exposed to various environments, a structure capable of moving the housing without power of the driving part may be required.

Technical problem(s) to be achieved are not limited to those described above, and other technical problems not mentioned herein will be clearly understood by those having ordinary knowledge in the art to which the present disclosure belongs, from the following description.

According to an embodiment, an electronic device may include a first housing; a second housing movably coupled to the first housing with respect to the first housing; a display disposed on the second housing and sliding into the first housing or sliding out from the first housing by the movement of the second housing; a motor disposed in the first housing; at least one driving gear rotatable by the motor and disposed in the first housing; at least one pinion gear rotatable by receiving driving force from the at least one driving gear; a rack gear disposed in the second housing, engaged with the at least one pinion gear and movable by the rotation of the at least one pinion gear. According to an embodiment, an electronic device may include a switching structure disposed in the first housing, and including a plurality of gears for connecting the at least one driving gear and the at least one pinion gear or releasing the connection between the at least one driving gear and the at least one pinion gear. According to an embodiment, the electronic device may include an actuator disposed in the first housing, configured to change a state of the switching structure.

According to an embodiment, the electronic device may include at least one processor operatively coupled to the motor and the actuator. According to an embodiment, the at least one processor is configured to change the state of the switching structure to a gear-connected state in which the at least one driving gear and the at least one pinion gear are connected, or a gear-released state in which the at least one driving gear and the at least one pinion gear are disconnected.

According to an embodiment, an electronic device may include a first housing; a second housing movably coupled to the first housing with respect to the first housing; a display disposed on the second housing and sliding into the first housing or sliding out from the first housing by the movement of the second housing; a motor disposed in the first housing; a pinion gear disposed in the first housing and rotatable by receiving driving force from the motor; a rack gear disposed in the second housing, engaged with the pinion gear and movable by the rotation of the pinion gear. According to an embodiment, an electronic device may include a switching structure disposed between the motor and the pinion gear, and changeable to a gear-connected state in which the motor and the pinion gear are connected or a gear-released state in which the motor and the pinion gear are disconnected. According to an embodiment, the electronic device may include an actuator connected to the switching structure and changing a state of the switching structure. According to an embodiment, the switching structure may include a first axis in which a driving gear is coupled and rotatable by the motor, one end of the first axis coupled to the motor. According to an embodiment, the switching structure may include a second axis in which a transmitting gear spaced apart from the driving gear is coupled, spaced apart from the first axis, and penetrating the pinion gear. According to an embodiment, the switching structure may include a cover housing including a first ring gear and a second ring gear spaced apart from the first ring gear along a direction parallel to the first axis, surrounding at least a part of the first axis and the second axis, and coupled to the actuator to be movable by the actuator. According to an embodiment, the first ring gear may be engaged with the driving gear within the gear-connected state, and may be spaced apart from the driving gear within the gear-released state. According to an embodiment, the second ring gear may be engaged with the driving gear within the gear-connected state and the gear-released state.

An electronic device according to an embodiment may provide a structure capable of moving the housing without damaging internal components of the electronic device by a switching structure that can be changed to a gear-connected state in which the motor and pinion gear are connected, and/or a gear-released state in which the motor and pinion gear are disconnected.

The example effects that can be obtained from the present disclosure are not limited to those described above, and any other effects not mentioned herein will be clearly understood by those having ordinary knowledge in the art to which the present disclosure belongs, from the following description.

BRIEF DESCRIPTION OF THE DRAWINGS

The above and other aspects, features, and advantages of certain example embodiments of the present disclosure will be more apparent from the following detailed description, taken in conjunction with the accompanying drawings, in which.

DETAILED DESCRIPTION

Figure 1:
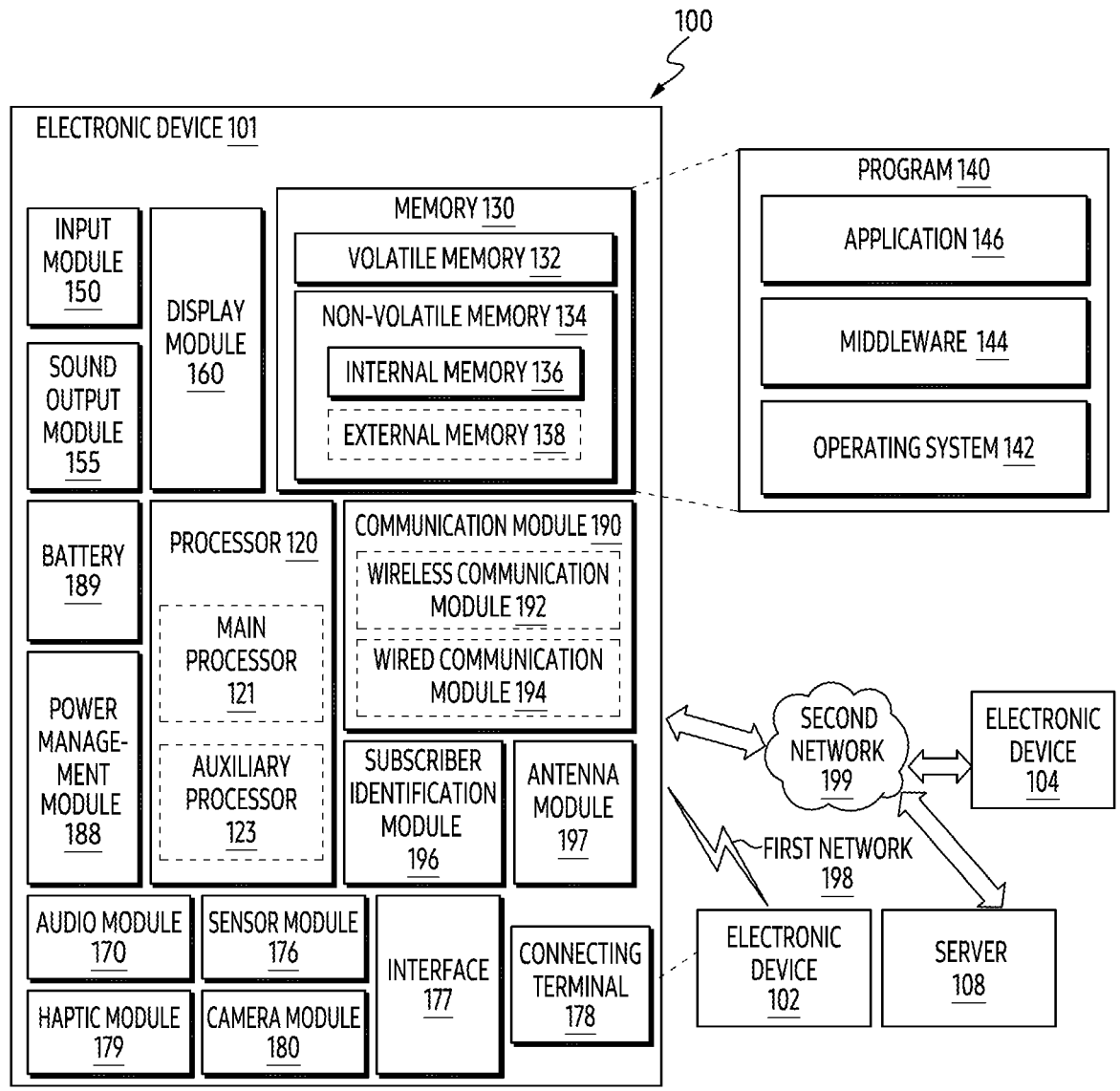
FIG. 1 is a block diagram of an electronic device in a network environment according to various example embodiments.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor

123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2A:
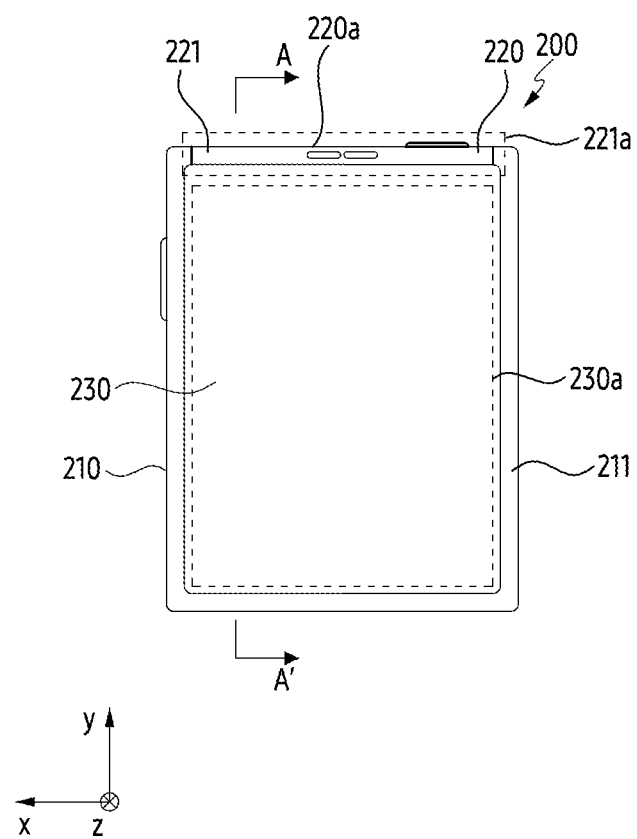
FIG. 2A is a front view of a first state of an electronic device according to an example embodiment.
Figure 2B:
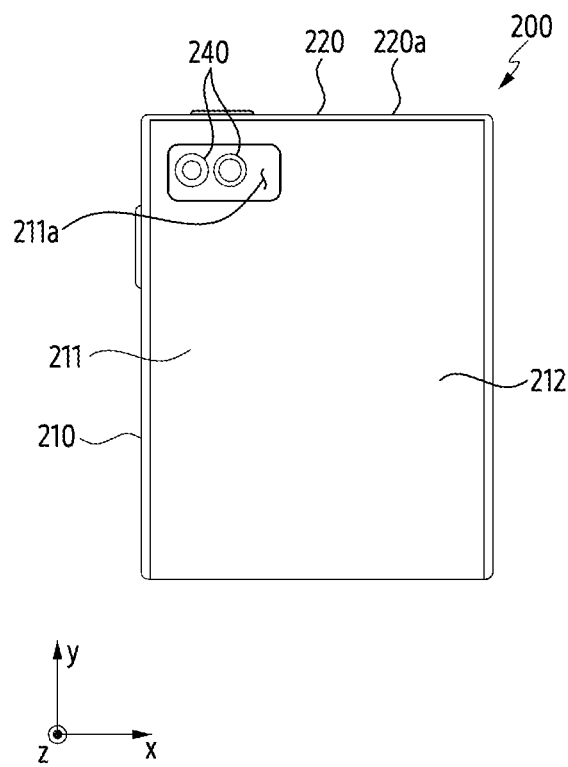
FIG. 2B is a rear view of a first state of an electronic device according to an example embodiment.
Figure 2C:
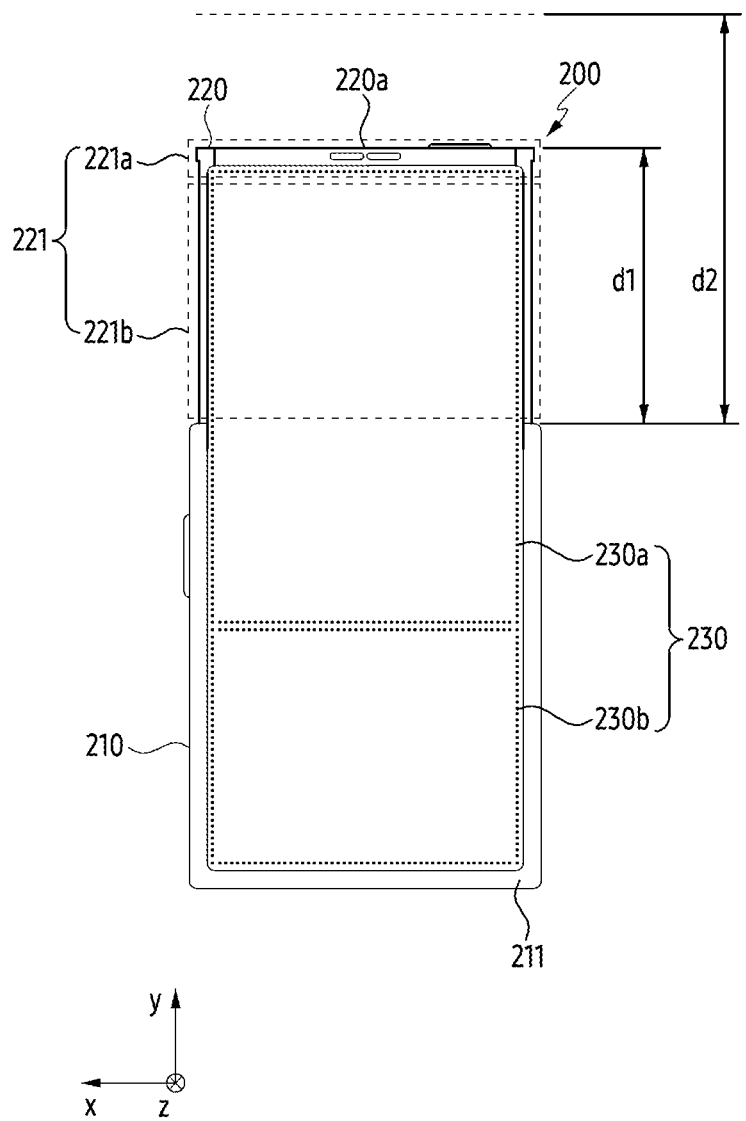
FIG. 2C is a front view of a second state of an electronic device according to an example embodiment.
Figure 2D:
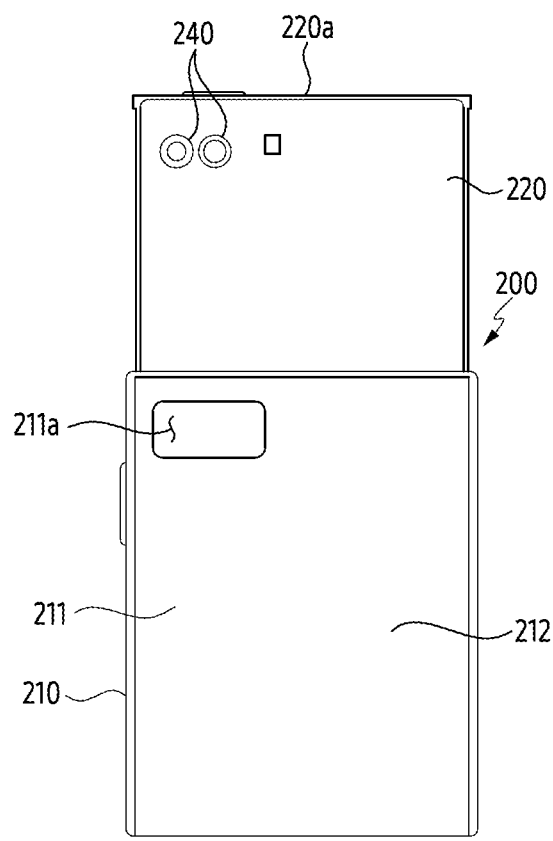
FIG. 2D is a rear view of a second state of an electronic device according to an example embodiment.

FIG. 2A is a front view of a first state of an electronic device according to an embodiment, FIG. 2B is a rear view of a first state of an electronic device according to an embodiment, FIG. 2C is a front view of a second state of an electronic device according to an embodiment, and FIG. 2D is a rear view of a second state of an electronic device according to an embodiment.

Referring to FIG. 2A, FIG. 2B, FIG. 2C, and FIG. 2D, according to an embodiment, an electronic device 200 (e.g., the electronic device 101 in FIG. 1) may include a first housing 210, a second housing 220, a display 230 (e.g., the display module 160 in FIG. 1), and a camera 240 (e.g., the camera module 180 in FIG. 1). According to an embodiment, the second housing 220 may be slidable with respect to the first housing 210. For example, the second housing 220 may move within a designated distance along the first direction (e.g., the +y direction) with respect to the first housing 210. When the second housing 220 moves along the first direction, a distance between a side surface 220a of the second housing 220 facing the first direction and the first housing 210 may increase. For another example, the second housing 220 may move within a designated distance along a second direction (e.g., the −y direction) opposite to the first direction with respect to the first housing 210. When the second housing 220 moves in the second direction, the distance between the side surface 220a of the second housing 220 facing the first direction and the first housing 210 may decrease. According to an embodiment, the second housing 220 may reciprocate linearly with respect to the first housing 210 by sliding relative to the first housing 210. For example, at least a part of the second housing 220 may be inserted into the first housing 210 or may be pulled from the first housing 210.

According to an embodiment, the electronic device 200 may be referred to as a "slidable electronic device" as the second housing 220 is designed to be slidable with respect to the first housing 210. According to an embodiment, the electronic device 200 may be referred to as a "rollable electronic device" as at least a part of the display 230 is designed to be rolled inside the second housing 220 (or the first housing 210) based on the slide movement of the second housing 220.

According to an embodiment, a first state of the electronic device 200 may be defined as a state in which the second housing 220 moves in the second direction (e.g., a contracted state or a slide-in state). For example, in the first state of the electronic device 200, the second housing 220 may be movable in the first direction, but may not be movable in the second direction. In the first state of the electronic device 200, a distance between the side surface 220a of the second housing 220 and the first housing 210 may increase as the second housing 220 moves, but may not decrease. For another example, in the first state of the electronic device 200, a part of the second housing 220 may be pulled out from the first housing 210, but may not be inserted. According to an embodiment, the first state of the electronic device 200 may be defined as a state in which the second area 230b of the display 230 is not visually exposed outside the electronic device 200. For example, in the first state of the electronic device 200, the second area 230b of the display 230 may be located inside the inner space (not shown) of the electronic device 200 formed by the first housing 210 and/or the second housing 220, and thus may not be visible from the outside of the electronic device 200.

According to an embodiment, the second state of the electronic device 200 may be defined as a state in which the second housing 220 moves in the first direction (e.g., an extended state or a slide-out state). For example, in the second state of the electronic device 200, the second housing 220 may be movable in the second direction but may not be movable in the first direction. In the second state of the electronic device 200, a distance between the side surface 220a of the second housing 220 and the first housing 210 may decrease as the second housing 220 moves, but may not increase. For another example, in the second state of the electronic device 200, a part of the second housing 220 may be inserted into the first housing 210, but may not be pulled out from the first housing 210. According to an embodiment, the second state of the electronic device 200 may be defined as a state in which the second area 230b of the display 230 is visually exposed from the outside of the electronic device 200. For example, in the second state of the electronic device 200, the second area 230b of the display 230 may be pulled out from the inner space of the electronic device 200 and thus visible from the outside of the electronic device 200.

According to an embodiment, when the second housing 220 moves in the first direction from the first housing 210, at least a part of the second housing 220 and/or the second area 230b of the display 230 may be pulled out from the first housing 210 by a pulled-out length d1 corresponding to the moving distance of the second housing 220. According to an embodiment, the second housing 220 may reciprocate within a designated distance d2. According to an embodiment, the pulled-out length d1 may have a size of approximately 0 to designated distance d2.

According to an embodiment, the state of the electronic device 200 may be convertible between the second state and/or the first state by manual operation by a user or automatic operation by a driving module (not shown) disposed inside the first housing 210 or the second housing 220. According to an embodiment, the driving module may trigger an operation based on a user input. According to an embodiment, the user input for triggering the operation of the driving module may include a touch input, a force touch input, and/or a gesture input through the display 230. According to another embodiment, the user input for triggering the operation of the driving module may include an audio input (voice input) or an input of a physical button exposed to the outside of the first housing 210 or the second housing 220. According to an embodiment, the driving module may be driven in a semi-automatic manner, in which an operation is triggered when a manual operation due to an external force of the user is detected.

According to an embodiment, the first state of the electronic device 200 may be referred to as a first shape, and the second state of the electronic device 200 may be referred to as a second shape. For example, the first shape may include a normal state, a contracted state, or a closed state, and the second shape may include an open state. According to an embodiment, the electronic device 200 may form a third state (e.g., an intermediate state) that is a state between the first state and the second state. For example, the third state may be referred to as a third shape, and the third shape may include a free stop state.

According to an embodiment, the display 230 may be visible (or viewable) from the outside through a front direction (e.g., the −z direction) of the electronic device 200 so that visual information may be displayed to the user. For example, the display 230 may include a flexible display. For another example, the display 230 may be referred to as a rollable display in that at least a part of the display 230 may be bent inside the first housing 210. According to an embodiment, the display 230 may be disposed in the second housing 220 and may be pulled out from the inner space (not shown) of the electronic device 200 or inserted into the inner space of the electronic device 200 according to the movement of the second housing 220. The inner space of the electronic device 200 may indicate a space in the first housing 210 and the second housing 220 formed by the combination of the first housing 210 and the second housing 220. For example, in the first state of the electronic device 200, at least a part of the display 230 may be rolled into and inserted into the inner space of the electronic device 200. When the second housing 220 moves in the first direction while at least a part of the display 230 is inserted into the inner space of the electronic device 200, at least a part of the display 230 may be pulled out from the inner space of the electronic device 200. For another example, when the second housing 220 moves in the second direction, at least a part of the display 230 may be rolled into the inner space of the electronic device 200, and thus may be inserted into the inner space of the electronic device 200. As at least a part of the display 230 is pulled out or inserted, the region of the display 230 visible from the outside of the electronic device 200 may be expanded or contracted. According to an embodiment, the display 230 may include a first region 230a and a second region 230b.

According to an embodiment, the first region 230a of the display 230 may be or include a region of the display 230 that may be fixedly visible from the outside of the electronic device 200, regardless of whether the electronic device 200 is in the second state or the first state. For example, the first region 230*a* may indicate a partial region of the display 230 that is not rolled into the inner space of the electronic device 200. According to an embodiment, when the second housing 220 moves, the first region 230*a* may move together with the second housing 220. For example, when the second housing 220 moves in the first or second direction, the first region 230*a* may move in the first or second direction on the front surface of the electronic device 200 together with the second housing 220.

According to an embodiment, the second region 230*b* of the display 230 may be connected to the first region 230*a*, and may be inserted into the inner space of the electronic device 200 or pulled out from the inner space of the electronic device 200 as the second housing 220 moves. For example, in the first state of the electronic device 200, the second region 230*b* of the display 230 may be in a rolled state and inserted into the inner space of the electronic device 200. In the first state of the electronic device 200, the second region 230*b* of the display 230 may be inserted into the inner space of the electronic device 200 and thus may not be visible from the outside. For another example, in the second state of the electronic device 200, the second region 230*b* of the display 230 may be pulled out from the inner space of the electronic device 200. The second region 230*b* of the display 230 may be visible from the outside of the electronic device 200 in the second state.

According to an embodiment, in the first state of the electronic device 200, the region of the display 230 visible from the outside of the electronic device 200 may include only the first region 230*a* of the display 230. The region of the display 230 visible from the outside of the electronic device 200 in the second state of the electronic device 200 may include at least a part of the first region 230*a* and the second region 230*b* of the display 230.

According to an embodiment, the first housing 210 of the electronic device 200 may include a book cover 211 surrounding the inner space of the first housing 210 and a rear plate 212 surrounding the rear surface of the book cover 211. The second housing 220 of the electronic device 200 may include a front cover 221 surrounding the inner space of the electronic device 200.

According to an embodiment, the front cover 221 may include a first cover region 221*a* of the front cover 221 that is not inserted into the first housing 210, and a second cover region 221 that is inserted into the first housing 210 or pulled out from the inside of the first housing 210. Regardless of whether the electronic device 200 is in the second state and the first state, the first cover region 221*a* of the front cover 221 may be always visible. According to an embodiment, at least a part of the first cover region 221*a* of the front cover 221 may form a side surface 220*a* of the second housing 220. According to an embodiment, the second cover region 221*b* of the second housing 220 may not be visible in the first state, but may be visible in the second state.

The camera 240 may obtain an image of a subject based on receiving light from the outside of the electronic device 200. According to an embodiment, the camera 240 may include one or a plurality of lenses, an image sensor, and/or an image signal processor. According to an embodiment, the camera 240 may be disposed in the second housing 220 to face the rear surface of the electronic device 200 opposite to the front surface of the electronic device 200 on which the first area 230*a* of the display 230 is disposed. For example, the camera 240 may be disposed on the front cover 221 of the second housing 220 and may be visible from the outside of the electronic device 200 through an opening 211*a* formed in the book cover 211 when the electronic device 200 is in the first state. For another example, the camera 240 may be disposed on the front cover 221 of the second housing 220 and may not be visible from the outside of the electronic device 200 because it is covered by the book cover 211 and/or the rear plate 212 when the electronic device 200 is in the first state.

According to an embodiment, the camera 240 may include a plurality of cameras. For example, the camera 240 may include a wide-angle camera, an ultra-wide-angle camera, a telephoto camera, a proximity camera, and/or a depth camera. However, the camera 240 is not necessarily limited to including a plurality of cameras, and may include one camera.

According to an embodiment, the camera 240 may further include a camera (not shown) facing the front of the electronic device 200 on which the first region 230*a* of the display 230 is disposed. When the camera 240 faces the front of the electronic device 200, the camera 240 may be an under display camera (UDC) disposed under the display 230 (e.g., the +z direction from the display 230), but is not limited thereto.

According to an embodiment, the electronic device 200 may include a sensor module (not shown) and/or a camera module (not shown) disposed under the display 230. The sensor module may detect an external environment based on information (e.g., light) received through the display 230. According to an embodiment, the sensor module may include at least one of a receiver, a proximity sensor, an ultrasonic sensor, a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, a motor encoder, or an indicator. According to an embodiment, at least a part of sensor module of the electronic device 200 may be visually exposed to the outside through a part of regions of the display 230. According to an embodiment, the electronic device 200 may detect a pulled out length (e.g., a length A) by using the sensor module. According to an embodiment, the electronic device 200 may generate pulled-out information on the degree of pulled-out detected by the sensor. For example, the electronic device 200 may detect and/or identify the degree to which the second housing 220 is pulled out by using the pulled out information. According to an embodiment, the pulled-out information may include information on a pulled-out length of the second housing 220.

According to an embodiment, the coupling shape of the first housing 210 and the second housing 220 is not limited to the shapes and coupling shown in FIGS. 2A, 2B, 2C, and 2D, and may be implemented by a combination and/or coupling of other shapes or components.

Figure 3A:
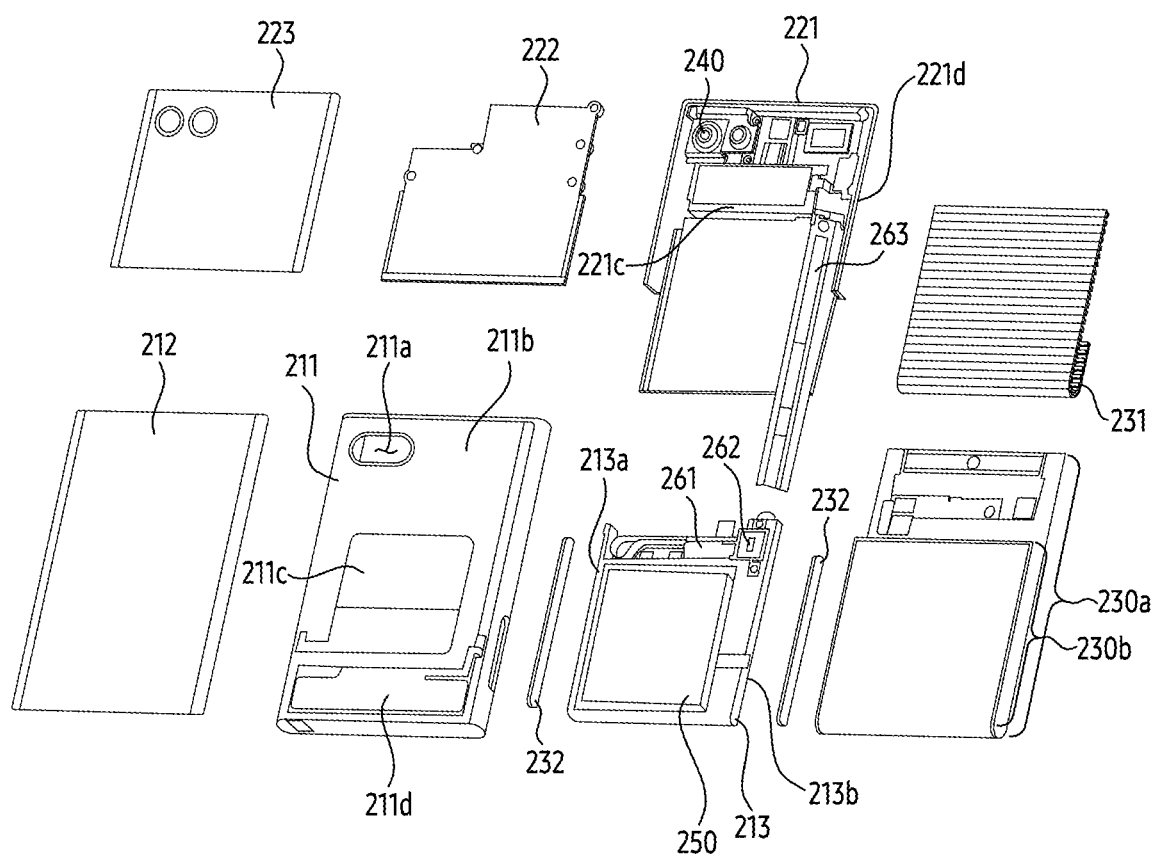
FIG. 3A is an exploded perspective view of an electronic device according to an example embodiment.
Figure 3A:
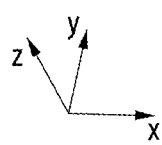
Figure 3B:
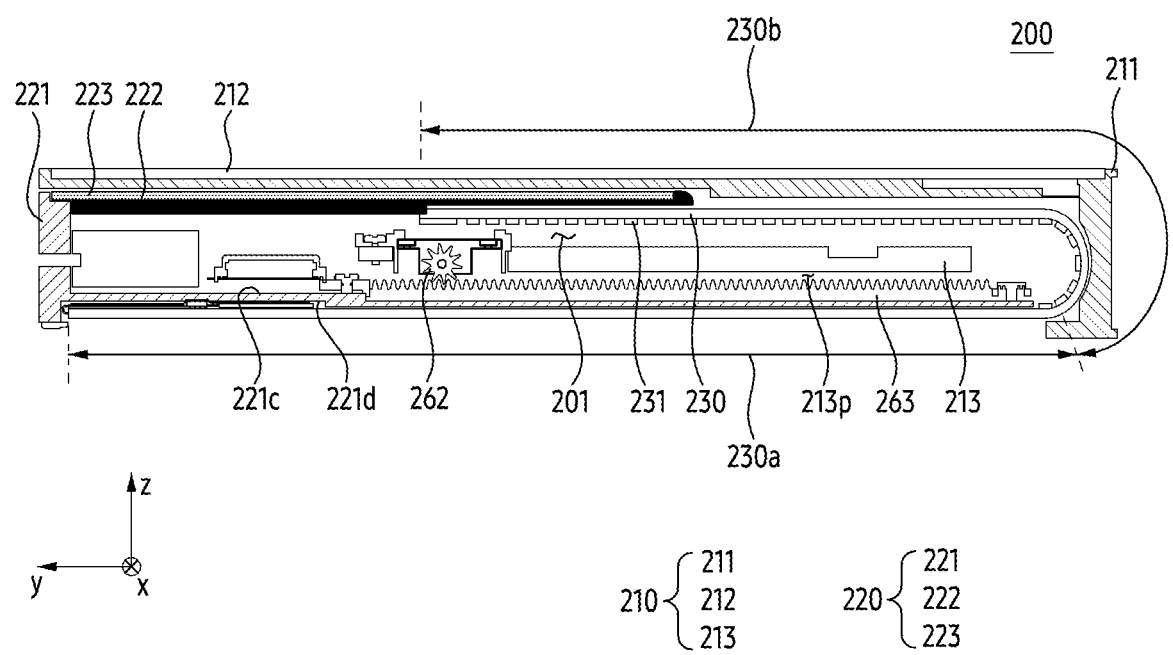
FIG. 3B is a cross-sectional view illustrating an example in which an electronic device according to an embodiment is cut along A-A' of FIG. 2A.

FIG. 3A is an exploded perspective view of an electronic device according to an embodiment, and FIG. 3B is a cross-sectional view illustrating an example in which an electronic device according to an embodiment is cut along A-A' of FIG. 2A.

Referring to FIGS. 3A and 3B, an electronic device 200 according to an embodiment may include a first housing 210, a second housing 220, a display 230, a camera 240, a battery 250 (e.g., the battery 189 of FIG. 1), and a driving part 260. According to an embodiment, the first housing 210 and the second housing 220 may be coupled to each other to form an inner space 201 of the electronic device 200. For example, in the first state of the electronic device 200, the second region 230b of the display 230 may be accommodated in the inner space 201.

According to an embodiment, the first housing 210 may include a book cover 211, a rear plate 212, and a frame cover 213. According to an embodiment, the book cover 211, the rear plate 212, and the frame cover 213 included in the first housing 210 may be coupled to each other and may not move with the second housing 220 when the second housing 220 moves with respect to the first housing 210.

According to an embodiment, the book cover 211 may form at least a part of an outer surface of the electronic device 200. For example, the book cover 211 may form at least a part of the side surface of the electronic device 200 and at least a part of the rear surface of the electronic device 200. According to an embodiment, the book cover 211 may provide a surface on which the rear plate 212 is seated. The rear plate 212 may be seated on one surface 211b of the book cover 211.

According to an embodiment, the frame cover 213 may support internal components of the electronic device 200. For example, the frame cover 213 may accommodate at least a part of the battery 250 and the driving portion 260. The battery 250 and the driving portion 260 may be accommodated in at least one of a recess or a hole included in the frame cover 213. According to an embodiment, the frame cover 213 may be surrounded by the book cover 211. For example, in the first state of the electronic device 200, a surface 213a of the frame cover 213 on which the battery 250 is disposed may face the book cover 211 and/or the second region 230b of the display 230. For another example, in the first state of the electronic device 200, another surface 213b of the frame cover 213 facing the one surface 213a of the frame cover 213 may face the first region 230a of the display 230 or the front cover 221. For example, the frame cover 213 may include aluminum as a material, but is not limited thereto.

According to an embodiment, the second housing 220 may include the front cover 221, a rear cover 222, and a slide cover 223. According to an embodiment, the front cover 221, the rear cover 222, and the slide cover 223 are coupled to each other and may move together with the second housing 220 when the second housing 220 moves relative to the first housing 210. The front cover 221 may support internal components of the electronic device 200. For example, the camera 240 may be disposed on one surface 221c of the front cover 221 facing the inner space 201. Another surface 221d of the front cover 221 facing the one surface 221c of the front cover 221 may face the first region 230a of the display 230 when the electronic device 200 is in the first state. According to an embodiment, the rear cover 222 may be coupled to the front cover 221 to protect components of the electronic device 200 disposed on the front cover 221. For example, the rear cover 222 may cover at least a part of one surface 221c of the front cover 221. According to an embodiment, the slide cover 223 may be disposed on the rear cover 222 to form an outer surface of the electronic device 200 together with the rear plate 212 and the book cover 211. The slide cover 223 may be coupled to one surface of the rear cover 222 to protect the rear cover 222 and/or the front cover 221.

According to an embodiment, when the electronic device 200 is in the first state, the display 230 may be bent by at least partially being rolled into the inner space 201. According to an embodiment, the display 230 may cover at least a part of the frame cover 213 and at least a part of the front cover 221. For example, when the electronic device 200 is in the first state, the display 230 may cover the other surface 221d of the front cover 221, and extend toward the inner space 201 by passing between the front cover 221 and the book cover 211. After passing between the front cover 221 and the book cover 211, the display 230 may surround the frame cover 213. The display 230 may cover one surface 213a of the frame cover 213 in the inner space 201. According to an embodiment, when the second housing 220 moves in the first direction, the second region 230b of the display 230 may be pulled out from the inner space 201. For example, as the second housing 220 moves in the first direction, the display 230 may pass between the front cover 221 and the book cover 211, and thus be pulled out from the inner space 201.

According to an embodiment, the first region 230a of the display 230 may be in contact with the other surface 221d of the front cover 221. For example, the first region 230a may extend parallel to the other surface 221d of the front cover 221 while contacting the other surface 221d of the front cover 221. The first region 230a may extend in parallel to the other surface 221d of the front cover 221, and thus may have a substantially plane shape. According to an embodiment, the first region 230a of the display 230 may not be deformed according to the movement of the second housing 220. For example, the first region 230a may move as the second housing 220 moves while maintaining the shape of a plane surface.

According to an embodiment, the second region 230b of the display 230 may be deformed according to the movement of the second housing 220. For example, when the electronic device 200 is in the first state, the second region 230b may be bent with a curvature in the inner space 201 of the electronic device 200. When the second housing 220 moves in the first direction (e.g., the +y direction), at least a part of the second region 230b may be pulled out from the inner space 201 of the electronic device 200 and may be parallel to the other surface 221d of the front cover 221. When at least a part of the second region 230b is parallel to the other surface 221d of the front cover 221, at least a part of the second region 230b may not have a curvature and may have a shape of a plane surface on the other surface 221d of the print cover 221. For another example, when the second housing 220 moves in the second direction (e.g., the −y direction), at least a part of the second region 230b may be inserted into the inner space 201 of the electronic device 200. At least a part of the second region 230b may be bent to have a curvature while being inserted into the inner space 201 of the electronic device 200.

According to an embodiment, the second region 230b of the display 230 may be deformed according to the movement of the second housing 220. For example, when the electronic device 200 is in the first state, the second region 230b may be bent with a curvature in the inner space 201 of the electronic device 200. When the second housing 220 moves in the first direction (e.g., the +y direction), at least a part of the second region 230b may be pulled out from the inner space 201 of the electronic device 200 and may be parallel to the other surface 221d of the front cover 221. When at least a part of the second region 230b is parallel to the other surface 221d of the front cover 221, at least a part of the second region 230b may not have a curvature and may have a shape of a plane surface. For another example, when the second housing 220 moves in the second direction (e.g., the −y direction), at least a part of the second region 230b may be inserted into the inner space 201 of the electronic device 200. At least a part of the second region 230b may be bent to have a curvature while being inserted into the inner space 201 of the electronic device 200.

According to an embodiment, a guide rail 232 may guide the movement of a guiding member 231. For example, as the display 230 moves, the guiding member 231 may move along the guide rail 232 coupled to the frame cover 213. According to an embodiment, the guide rail 232 may include a plurality of guide rails 232 disposed to be spaced apart from each other at both peripheries of the frame cover 213 spaced apart from each other in a third direction perpendicular to the first direction (e.g., the +x direction).

According to an embodiment, the driving portion 260 may provide a driving force to the second housing 220 so that the second housing 220 may move relative to the first housing 210. According to an embodiment, the driving portion 260 may include a motor 261, a pinion gear 262, and a rack gear 263. The motor 261 may receive power from the battery 250 and provide a driving force to the second housing 220. According to an embodiment, the motor 261 may be disposed in the first housing 210 and may not move together with the second housing 220 when the second housing 220 moves with respect to the first housing 210. For example, the motor 261 may be disposed in a recess formed in the frame cover 213. According to an embodiment, the pinion gear 262 may be coupled to the motor 261 and may be rotated by a driving force provided from the motor 261. According to an embodiment, the rack gear 263 may be engaged with the pinion gear 262 and may move according to rotation of the pinion gear 262. For example, the rack gear 263 may reciprocate linearly in the first direction or the second direction according to the rotation of the pinion gear 262. According to an embodiment, the rack gear 263 may be disposed in the second housing 220. For example, the rack gear 263 may be coupled to the front cover 221 included in the second housing 220. According to an embodiment, the rack gear 263 may be movable inside the operating space 213p formed in the frame cover 213.

According to an embodiment, when the pinion gear 262 rotates in the first rotation direction (e.g., clockwise in FIG. 3B), the rack gear 263 may move in the first direction (e.g., the +y direction). When the rack gear 263 moves in the first direction, the second housing 220 coupled to the rack gear 263 may move in the first direction. When the pinion gear 262 rotates in a second rotation direction (e.g., counterclockwise in FIG. 3B), the rack gear 263 may move in a second direction (e.g., the −y direction). When the rack gear 263 moves in the second direction, the second housing 220 coupled to the rack gear 263 may move in the second direction. As the second housing 220 moves in the second direction, the area of the display 230 visible from the outside of the electronic device 200 may be contracted.

In the above description, it has been described that the motor 261 and the pinion gear 262 are disposed in the first housing 210, and the rack gear 263 is disposed with the second housing 220, but embodiments are not limited thereto. According to embodiments, the motor 261 and the pinion gear 262 may be disposed in the second housing 220, and the rack gear 263 may be disposed in the first housing 210.

As the electronic device 200 is exposed to various environments, a user may request a structure in which the operating state of the driving part 260 may be changed according to a situation. For example, since the second housing 420 cannot be moved as much as the user intended through the motor 261 in case that the battery 250 lacks power, the user may manually or semi-automatically move the second housing 420 with respect to the first housing 410. Since the motor 261 and the pinion gear 262 are always maintained in a connected state in case that the second housing 420 is moved by manual operation, damage to components (e.g., deceleration gear) in the motor 261 may occur by the rotation of the pinion gear 262 by an external force. For another example, the electronic device 200 may require a structure in which the driving force of the driving part 260 provided in the second housing 220 may be converted according to the temperature of the surrounding environment of the electronic device 200. Hereinafter, the electronic device 200 including a structure for changing the operating state of the driving part 260 will be described in detail.

Figure 4A:
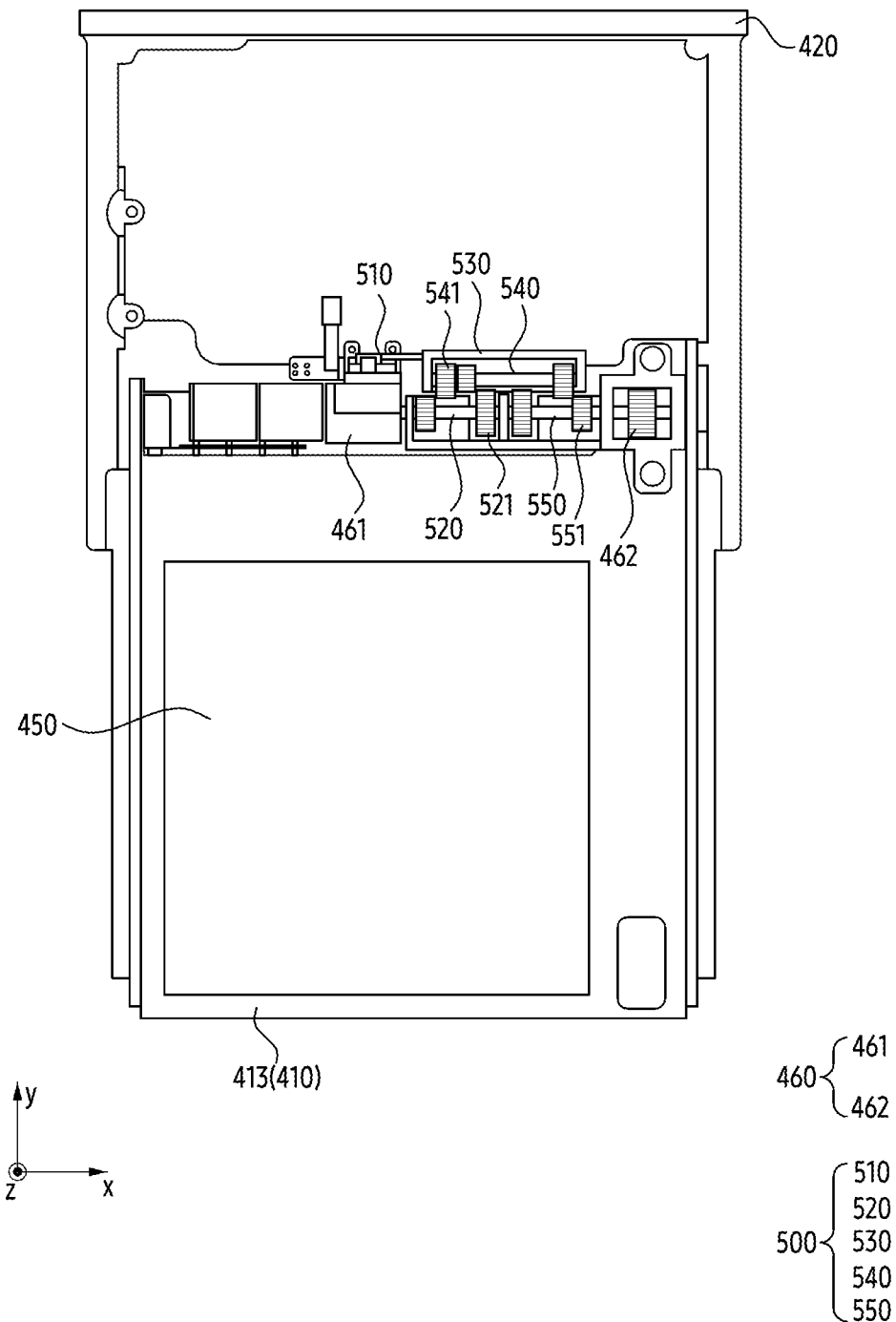
FIG. 4A is a rear view of a first state of an electronic device according to an example embodiment.
Figure 4B:
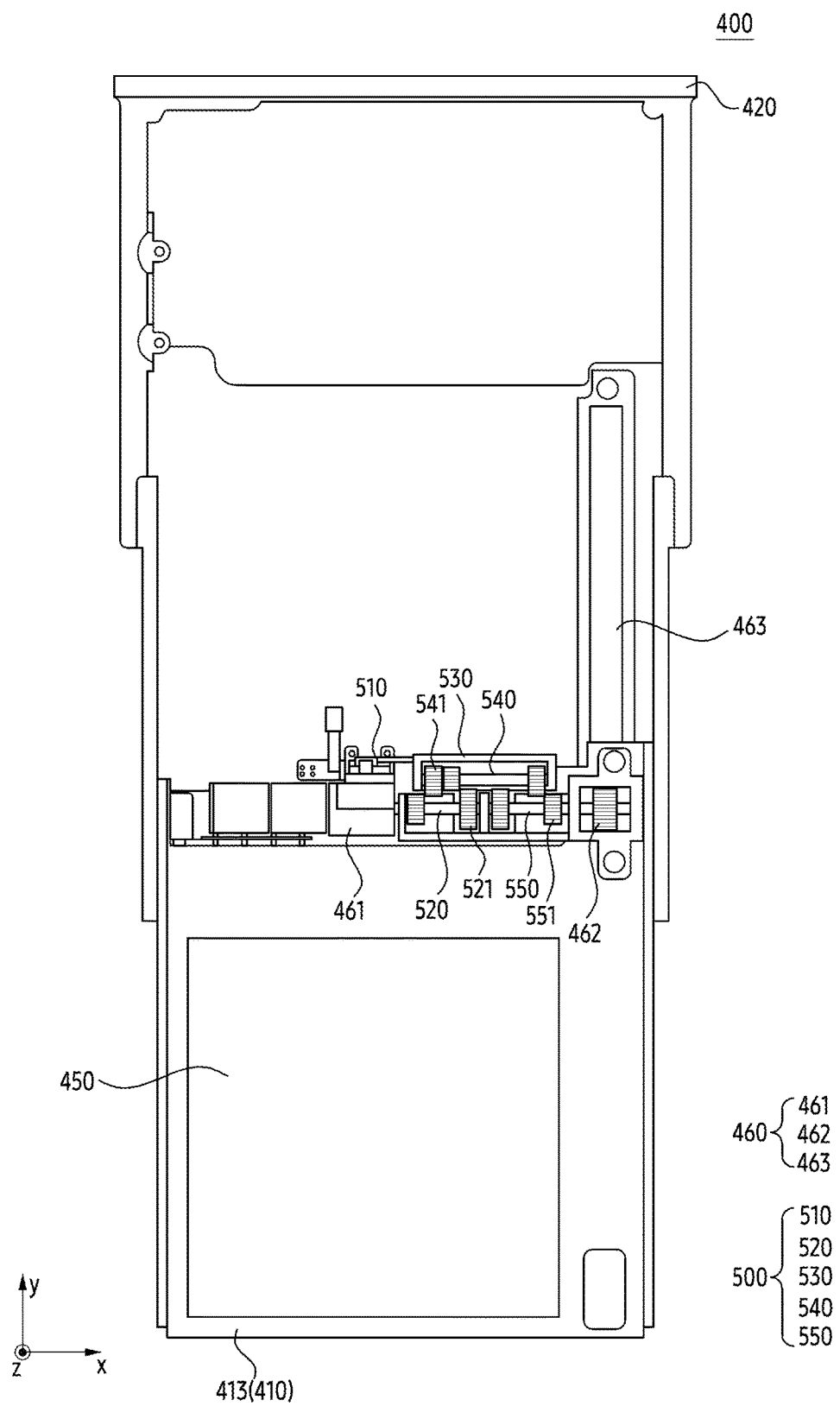
FIG. 4B is a rear view of a second state of an electronic device according to an example embodiment.
Figure 4C:
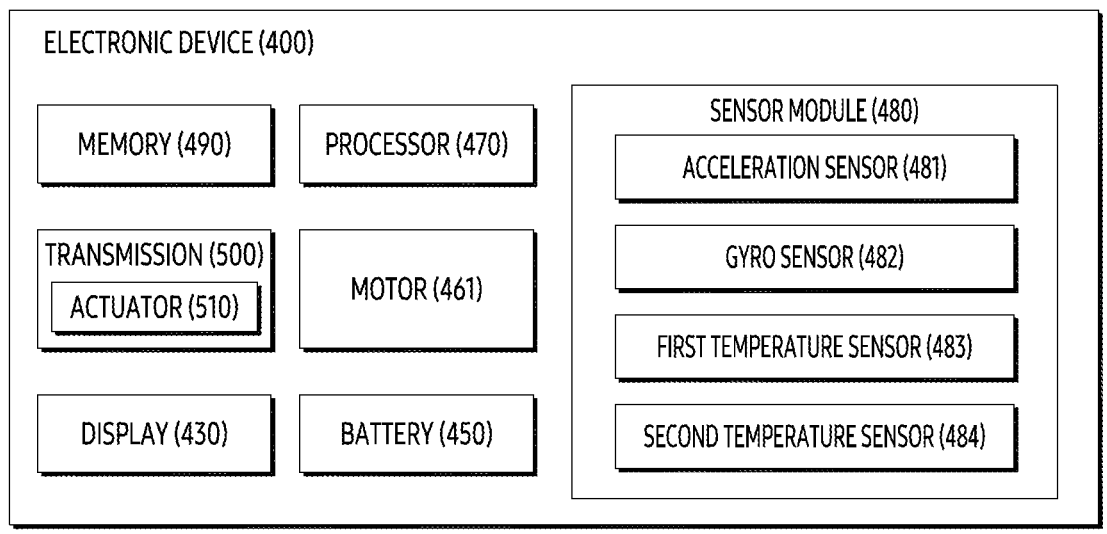
FIG. 4C is a block diagram of an electronic device according to an example embodiment.

FIG. 4A is a rear view of a first state of an electronic device according to an embodiment, FIG. 4B is a rear view of a second state of an electronic device according to an embodiment, and FIG. 4C is a block diagram of an electronic device according to an embodiment.

Referring to FIG. 4A, FIG. 4B, and FIG. 4C, according to an embodiment, the electronic device 400 (e.g., the electronic device 101 in FIG. 1 and/or the electronic device 200 in FIG. 3A and FIG. 3B) may include a first housing 410, a second housing 420, a display 430, a battery 450, a driving part 460, a processor 470, a sensor module 480, a memory 490, and a switching structure 500. The first housing 410, the second housing 420, the display 430, the battery 450, and the driving part 460 of FIGS. 4A and 4B may be substantially the same as the first housing 210, the second housing 220, the display 230, the battery 250, and the driving part 260 of FIGS. 3A and 3B, respectively, and thus repeated descriptions will be omitted. Since the processor 470, the sensor module 480 and the memory 490 of FIG. 4C may be substantially the same as the processor 120, the sensor module 176, and the memory 130 of FIG. 1, repeated descriptions will be omitted.

According to an embodiment, the first housing 410 may form at least a part of an outer surface of the electronic device 400 gripped by a user. The first housing 410 may surround at least a part of the second housing 420. For example, the second housing 420 may be coupled to the first housing 410 so that at least a part thereof may be inserted into the first housing or may be pulled out from the first housing 410. According to an embodiment, the first housing 410 may include a frame cover 413 for accommodating components. Since the frame cover 413 of FIGS. 4A and 4B may be substantially the same as the frame cover 213 of FIGS. 3A and 3B, repeated descriptions will be omitted.

According to an embodiment, the second housing 420 may be coupled to the first housing 410 to be slidable with respect to the first housing 410. For example, the second housing 420 may be movable in a first direction (e.g., in the +y direction) or a second direction (e.g., in the −y direction) opposite to the first direction with respect to the first housing 410. The first direction may be a direction in which the area of the display 430 viewable from the outside of the electronic device 400 is expanded according to the movement of the second housing 420. The second direction may be a direction in which the area of the display 430 viewable from the outside of the electronic device 400 is contracted according to the movement of the second housing 420.

According to an embodiment, the state of the electronic device 400 may include a first state in which the second housing 420 may move in the first direction among the first direction and the second direction, and a second state in which the second housing 420 may move in the second direction among the first direction and the second direction. For example, when the electronic device 400 is in the first state, the second housing 420 may only be movable in the first direction and may not be movable in the second direction. For another example, when the electronic device 400 is in the second state, the second housing 420 may only be movable in the second direction and may not be movable in the first direction.

According to an embodiment, the display 430 may be disposed in the second housing 420 and may move together with the second housing 420 according to the movement of the second housing 420. For example, at least a part of the display 430 may be bent with a curvature inside the electronic device 400 when the electronic device 400 is in the first state. When the second housing 420 moves in the first direction, at least a part of the display 430 may be pulled out to the outside of the electronic device 400. At least a part of the display 430 pulled out to the outside of the electronic device 400 may have a substantially plane shape. For another example, when the second housing 420 moves in the second direction opposite to the first direction, at least a part of the display 430 pulled out outside the electronic device 400 may be inserted into the electronic device 400. At least a part of the inserted display 430 may be rolled into the electronic device 400 and bent with a curvature.

According to an embodiment, the battery 450 may supply power to components (e.g., a motor 461) of the electronic device 400. The battery 450 may be disposed on the frame cover 413 of the first housing 410. For example, the battery 450 may be accommodated in a recess or hole formed in the frame cover 413.

According to an embodiment, the driving part 460 may provide a driving force to the second housing 420 so that the second housing 420 may move with respect to the first housing 410. According to an embodiment, the driving part 460 may include a motor 461, a pinion gear 462, and a rack gear 463. The motor 461 may be disposed in the first housing 410 and may provide driving force to the second housing 420 through the power supplied from the battery 450. For example, the motor 461 may be disposed at the periphery of the frame cover 413 facing the first direction. The pinion gear 462 may be disposed on the first housing 410. The pinion gear 462 may be rotatable by receiving a driving force from the motor 461. The rack gear 463 may be disposed in the second housing 420 and may be engaged with the pinion gear 462. The rack gear 463 may be movable according to rotation of the pinion gear 462. For example, the rack gear 463 may move the second housing 420 in the first direction with respect to the first housing 410, by moving in the first direction (e.g., the +y direction) by rotation of the pinion gear 462. For another example, the rack gear 463 may move the second housing 420 in the second direction with respect to the first housing 410, by moving in a second direction (e.g., in the −y direction) opposite to the first direction by rotation of the pinion gear 462.

According to an embodiment, the processor 470 may control components of at least one electronic device 400 operatively coupled to the processor 470, and may perform various data processing. For example, the processor 470 may be operatively coupled to the display 430, the motor 461 of the driving part 460, and the actuator 510 of the switching structure 500.

According to an embodiment, the sensor module 480 may detect an operating state of the electronic device 400 or an external environmental state of the electronic device 400 and obtain an electrical signal or data corresponding to the detected state. For example, the sensor module 480 may include an acceleration sensor 481 and a gyro sensor 482 for sensing the motion state of the electronic device 400. The acceleration sensor 481 and the gyro sensor 482 may be referred to as a motion sensor for sensing the motion of the electronic device 400. The acceleration sensor 481 may detect the acceleration of the electronic device 400 to obtain data on the motion state of the electronic device 400. The gyro sensor 482 may measure the angular velocity of the electronic device 400 to obtain data on a posture of the electronic device 400. For another example, the sensor module 480 may include a first temperature sensor 483 and a second temperature sensor 484 for sensing the temperature of components of the electronic device 400.

According to an embodiment, the memory 490 may record various data used by the processor 470 or the sensor module 480. For example, the data may include input data or output data for software (e.g., program 140 of FIG. 1) and commands related thereto. As another example, the data may include one or more instructions executed when the processor 470 is operated.

The switching structure 500 may be connected to at least a part of the driving part 460, and may change the operating state of the driving part 460. According to an embodiment, the switching structure 500 may be disposed between the motor 461 and the pinion gear 462. According to an embodiment, the switching structure 500 may be changed to a gear-connected state in which the motor 461 and the pinion gear 462 are connected or a gear-released state in which the motor 461 and the pinion gear 462 are disconnected. The gear-connected state may indicate a state in which a driving force of the motor 461 may be transmitted to the pinion gear 462. The gear-connected state may be referred to as a driving state in that the second housing 420 may be moved. For example, the gear-connected state may include a first gear-connected state and a second gear-connected state having a higher gear ratio than the first gear-connected state. The gear ratio may correspond to the magnitude of the driving force of the pinion gear 462 moving the rack gear 463. As the gear ratio of the switching structure 500 increases, the magnitude of the driving force of the pinion gear 462 moving the rack gear 463 may increase. According to an embodiment, the gear ratio may be defined by the product of the gear teeth number of each of the gears 521, 541, and 551 of the switching structure 500 disposed between the motor 461 and the pinion gear 462. For example, in the first gear-connected state, part of the gears 521, 541, and 551 of the switching structure 500 may be engaged. In the second gear-connected state, other part of the gears 521, 541, and 551 of the switching structure 500 may be engaged. A product of the gear teeth numbers of a part of the gears 521, 541, and 551 of the switching structure 500 engaged with each other within the first gear-connected state may be defined as the first gear ratio, and a product of gear teeth numbers of a part of the gears 521, 541, and 551 of the switching structure 500 engaged with each other within the second gear-connected state may be defined as a second gear ratio higher than the first gear ratio. According to an embodiment, the switching structure 500 may be referred to as a gear box in terms of including a plurality of gears 521, 541, and 551. The switching structure 500 may be referred to as a transmission in that the connection relationship between the plurality of gears 521, 541, and 551 may be changed.

According to an embodiment, the gear-released state may indicate a state in which the driving force of the motor 461 is not transmitted to the pinion gear 462 because the motor 461 and the pinion gear 462 are disconnected. In the gear-released state, the connection of the motor 461 and the pinion gear 462 is disabled. The gear-released state may be referred to as a neutral state in terms of being blocked power transmission of the motor 461 and the pinion gear 462. For example, when the switching structure 500 is in a gear-released state, the pinion gear 462 may not be rotated by the driving force of the motor 461 despite the operation of the motor 461. For another example, when the switching structure 500 is in a gear-released state, the pinion gear 462 may be independently rotatable with respect to the motor 461. As the pinion gear 462 can be rotated independently with respect to the motor 461, the second housing 420 may be moved manually with respect to the first housing 410 without affecting the motor 461 when the switching structure 500 is in a gear-released state. For example, as the pinion gear 462 is rotated by an external force manually operating the second housing 420 when the connection between the pinion gear 462 and the motor 461 is always maintained, the driving force by the rotation of the pinion gear 462 may be transmitted to the motor 461. When the driving force by the rotation of the pinion gear 462 is transmitted to the motor 461, components inside the motor 461 may be damaged. According to an embodiment, the electronic device 400 may provide a structure in which the second housing 420 may manually move without damage to the motor 461 by the switching structure 500 that may be changed to a gear-released state in which the motor 461 and the pinion gear 462 are disconnected.

According to an embodiment, the switching structure 500 may include an actuator 510, a first axis 520, a cover housing 530, a second axis 540, and a third axis 550. The actuator 510 may be disposed in the first housing 410 and may change the state of the switching structure 500. For example, the actuator 510 may be disposed at the periphery of the frame cover 413 facing the first direction (e.g., the +y direction).

According to an embodiment, the first axis 520 may be rotatably connected to the motor 461. For example, one end of the first axis 520 may be inserted into the motor 461. According to an embodiment, at least one driving gear 521 may be coupled to the first axis 520 and transmit the driving force of the motor 461. For example, the first axis 520 may penetrate at least one driving gear 521. When the first axis 520 is rotated by the motor 461, at least one driving gear 521 may be rotated by the rotation of the first axis 520. According to an embodiment, the first axis 520 may be disposed in the first housing 410 and may be rotatable with respect to the first housing 410.

According to an embodiment, the cover housing 530 may accommodate the components moved by the actuator 510. The cover housing 530 may be connected to the actuator 510 and may be moved by the actuator 510. The cover housing 530 may be movable in a direction parallel to the first axis 520 by the actuator 510. For example, the cover housing 530 may be movable in a third direction (e.g., +x direction) that is a direction from the motor 461 toward the pinion gear 462 or a fourth direction (e.g., −x direction) opposite to a third direction from that is a direction the pinion gear 462 toward the motor 461.

According to an embodiment, the second axis 540 may be coupled to the cover housing 530 and may move together with the cover housing 530. The second axis 540 may be coupled to the cover housing 530 to be rotatable with respect to the cover housing 530. At least one connection gear set 541 may be coupled to the second axis 540 and rotatable with respect to the cover housing 530. For example, the second axis 540 may penetrate at least one connection gear set 541. When the switching structure 500 is in a gear-connected state, at least a part of the connection gear set 541 may be engaged with at least one driving gear 521 and thus rotated by the rotation of the driving gear 521. As at least a part of the connection gear set 541 rotates, the second axis 540 may rotate with respect to the cover housing 530. When the switching structure 500 is in a gear-released state, the engagement of at least one connection gear set 541 and at least one driving gear 521 may be released. As engagement with at least one driving gear 521 is released, at least one connection gear set 541 may not be rotated by at least one driving gear 521.

According to an embodiment, the third axis 550 may be coupled to the pinion gear 463. For example, the third axis 550 may penetrate the pinion gear 462. According to an embodiment, the third axis 550 may be disposed in the first housing 410 and may be rotatable with respect to the first housing 410. At least one transmitting gear 551 may be coupled to the third axis 550 For example, the third axis 550 may penetrate at least one transmitting gear 551. When the switching structure 500 is in a gear-connected state, at least one transmitting gear 551 may be rotated by at least one other part of the connection gear set 541, by being engaged with the other part of the at least one connection gear set 541. As at least one connection gear set 541 rotates, the third axis 550 may rotate with respect to the first housing 410. As the third axis 550 rotates, the pinion gear 462 connected to the third axis 550 rotates, and the rack gear 463 may move with respect to the first housing 410. When the rack gear 463 moves, the second housing 420 connected to the rack gear 463 moves, and thus the display 430 may be expanded or contracted.

According to an embodiment, the state of the switching structure 500 may be changed according to the movement of the cover housing 530 by the actuator 510. For example, when the cover housing 530 is moved by the actuator 510, the connection relationship between the gears 521, 541, and 551 in the switching structure 500 is changed, and thus the state of the switching structure 500 may be changed. For example, the state of switching structure 500 may be changed from a first gear-connected state in which some of the gears 521, 541, and 551 are engaged with each other to a gear-released state in which engagement of the gears 521, 541, and 551 is released. For another example, the state of the switching structure 500 may be changed from the first gear-connected state in which some of the gears 521, 541, and 551 are engaged with each other and to a second gear-connected state having a higher gear ratio than the first gear-connected state.

According to an embodiment, the processor 470 may be configured to change the switching structure 500 to a gear-connected state or a gear-released state through the actuator 510 based on identifying a designated event. For example, the processor 470 may be configured to change the switching structure 500 from the gear-connected state (e.g., a first gear-connected state or a second gear-connected state) to the gear-released state based on identifying a designated event. For another example, the processor 470 may be configured to change the switching structure 500 from the first gear-connected state to the second gear-connected state or the second gear-connected state to the first gear-connected state based on identifying the designated event.

According to an embodiment, the designated event may include a case in which a user input for changing the state of switching structure 500 is received or an abnormal state of the electronic device 400 is detected through sensor module 480. For example, the abnormal state of the electronic device 400 may include a case in which the electronic device 400 falls, a case in which the electronic device 400 is in a low power state, a case in which the electronic device 400 is overheated, and a case in which the electronic device 400 is exposed to a low temperature environment.

According to an embodiment, the processor 470 may be configured to change the state of switching structure 500 to the gear-connected state or the gear-released state through actuator 510, based on receiving a user input requesting a change in the state of switching structure 500. For example, the user input may include at least one of an input through an input module (e.g., the input module 150 of FIG. 1) and an input through the display 430.

According to an embodiment, when switching structure 500 is in the gear-connected state, the processor 470 may be configured to change the switching structure 500 from the gear-connected state to a gear-released state through the actuator 510 based on identifying that the data obtained from the motion sensor exceeds the designated value. For example, when an acceleration value of the electronic device 400 obtained from the acceleration sensor 481 exceeds a first designated value, the processor 470 may change the switching structure 500 from the gear-connected state to the gear-released state through actuator 510. The first designated value may be set to correspond to the acceleration value obtained by the acceleration sensor 481 when the electronic device 400 falls. The processor 470 may identify that the electronic device 400 is falling based on identifying that the acceleration value obtained from the acceleration sensor 481 exceeds the first designated value. For another example, when an angular velocity value of the electronic device 400 obtained from the gyro sensor 482 exceeds a second designated value, the processor 470 may change the switching structure 500 from the gear-connected state to the gear-released state through actuator 510. The second designated value may be set to correspond to the angular velocity value obtained by the gyro sensor 482 when the electronic device 400 falls. The processor 470 may identify that the electronic device 400 is falling based on identifying that the angular velocity value obtained by the gyro sensor 482 exceeds the second designated value. For example, when the switching structure 500 is in a gear-connected state, the pinion gear 462 may be rotated by an impact generated when the electronic device 400 freely falls and collides with the ground. Since the motor 461 and the pinion gear 462 are connected when the switching structure 500 is in the gear-connected state, the driving force by the rotation of the pinion gear 462 may be transmitted to the motor 461. When the driving force by the rotation of the pinion gear 462 is transmitted to the motor 461, components inside the motor 461 may be damaged. The electronic device 400 according to an embodiment may prevent or reduce damage to the motor 461 by the processor 470 configured to change the state of the switching structure 500 from the gear-connected state to the gear-released state when the electronic device 400 falls.

According to an embodiment, when the switching structure 500 is in the gear-connected state, the processor 470 may be configured to change the switching structure 500 from the gear-connected state to the gear-released state through actuator 510 based on identifying that the power of battery 450 is less than a third designated value. When the amount of power of the battery 450 is less than the third designated value, the processor 470 may identify the electronic device 400 as being in a low power state. For example, when the electronic device 400 is in the low power state, the second housing 420 may not be moved by the motor 461 as power supplied to the motor 461 becomes insufficient. When the second housing 420 is manually moved by a user in the gear-connected state of the switching structure 500 connected to the motor 461 and the pinion gear 462, the internal components of the motor 461 may be damaged. The electronic device 400 according to an embodiment may prevent or reduce the likelihood of damage to the motor 461 by the processor 470 configured to change the switching structure 500 from the gear-connected state to the gear-released state when the electronic device 400 is in the low power state.

According to an embodiment, the processor 470 may be configured to change the state of the switching structure 500 through the actuator 510 based on identifying that the temperature obtained through the first temperature sensor 483 for sensing the temperature of the motor 461 exceeds a fourth designated value. The processor 470 may identify that the motor 461 is overheated based on identifying that the temperature obtained by the first temperature sensor 483 exceeds the fourth designated value. For example, when the temperature of the motor 461 exceeds the fourth designated value, the processor 470 may be configured to change the switching structure 500 from the first gear-connected state to the second gear-connected state having a gear ratio higher than the first gear-connected state through the actuator 510. Since the load of the motor 461 is reduced as the switching structure 500 is changed to the second gear-connected state having a higher gear ratio, the temperature of the overheated motor 461 may be reduced. For another example, when the temperature of the motor 461 exceeds the fourth designated value, the processor 470 may be configured to change the switching structure 500 from the gear-connected state (e.g., a first gear-connected state or a second gear-connected state) to the gear-released state through the actuator 510.

According to an embodiment, the processor 470 may be configured to change the switching structure 500 from the first gear-connected state to the second gear-connected state based on identifying that the temperature obtained from the second temperature sensor 484 for sensing the temperature of the display 430 is less than a fifth designated value. For example, the fifth designated value may be a Celsius temperature of −10° C. or less, but is not limited thereto. The processor 470 may identify that the electronic device 400 is exposed to a low temperature environment based on identifying that the temperature of the display 430 is less than the fifth designated value. When the temperature of the display 430 is less than the fifth designated value, as the repulsive force of the display 430 increases, a driving force required to expand the display 430 may increase. The electronic device 400 according to an embodiment may smoothly be expanded or contracted the display 430 in a relatively low temperature environment by the processor 470 configured to change the switching structure 500 from the first gear-connected state to the second gear-connected state when the temperature of the display 430 is less than the fifth designated value.

As described above, according to an embodiment, the electronic device 400 may provide a structure in which the second housing 420 may be manually operated without damaging components of the electronic device 400 by the switching structure 500 capable of connecting or releasing the motor 461 and the pinion gear 462. The electronic device 400 according to an embodiment may smoothly expand or contract the display 430 while preventing or reducing the likelihood of damage to components of the electronic device 400 in various environments, by the processor 470 configured to change the state of switching structure 500 based on identifying the designated event.

Figure 5A:
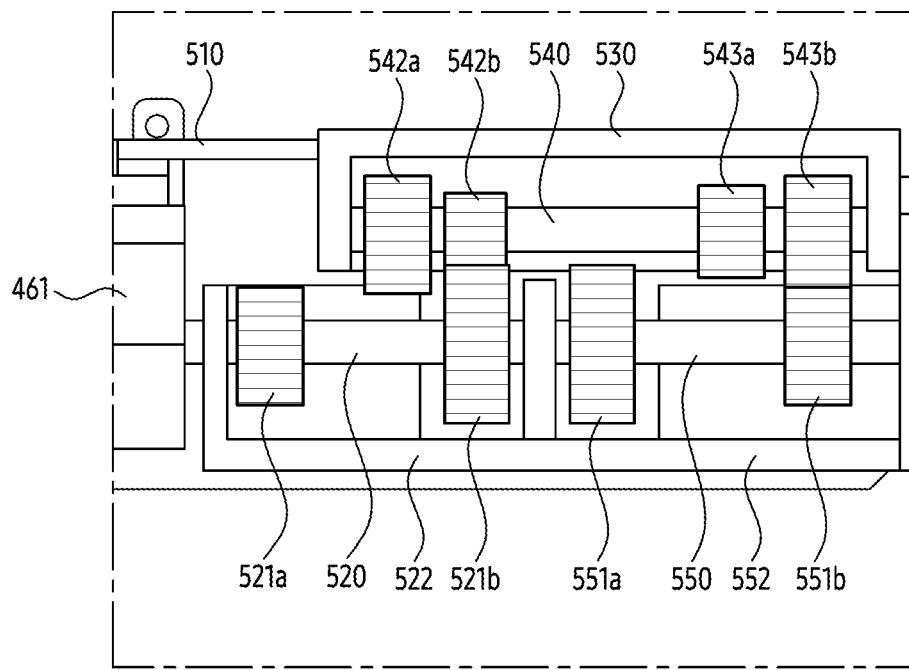
FIG. 5A illustrates a first gear-connected state of a switching structure of an electronic device according to an example embodiment.
Figure 5A:
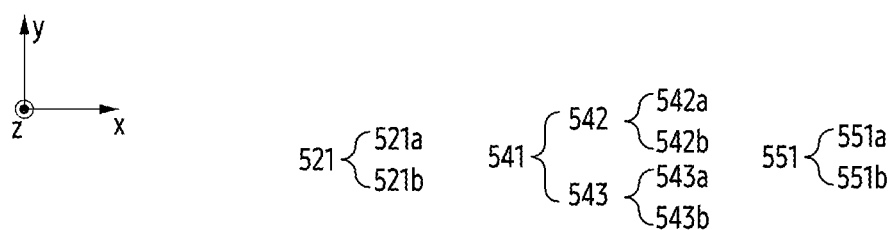
Figure 5B:
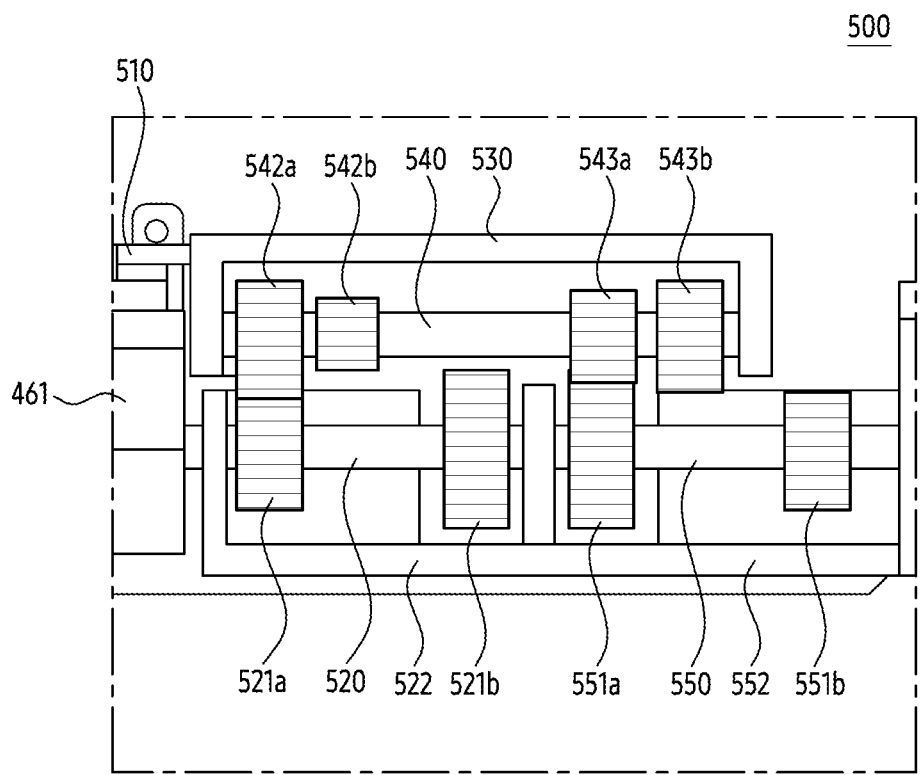
FIG. 5B illustrates a second gear-connected state of a switching structure of an electronic device according to an example embodiment.
Figure 5C:
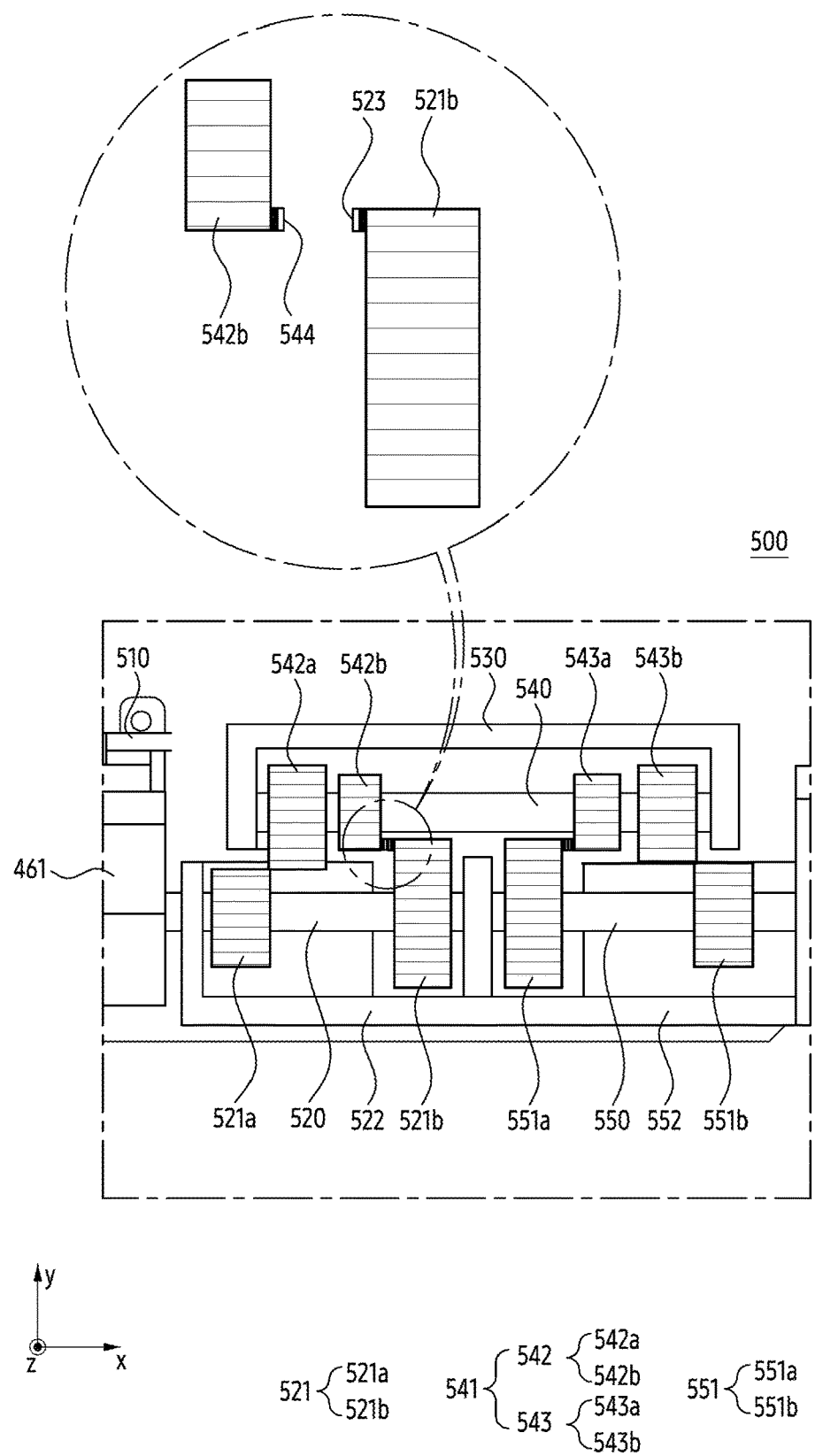
FIG. 5C illustrates a gear-released state of a switching structure of an electronic device according to an example embodiment.

FIG. 5A illustrates a first gear-connected state of a switching structure of an electronic device according to an embodiment, FIG. 5B illustrates a second gear-connected state of a switching structure of an electronic device according to an embodiment, and FIG. 5C illustrates a gear-released state of a switching structure of an electronic device according to an embodiment.

Referring to FIGS. 5A, 5B, and 5C, the switching structure 500 according to an embodiment may further include a first gear housing 522 and a second gear housing 552.

According to an embodiment, the first gear housing 522 may support a first axis 520. The first gear housing 522 may be disposed in a first housing (e.g., the first housing 410 of FIGS. 4A and 4B). The first axis 520 and at least one driving gear 521 may be coupled to the first gear housing 522. For example, the first axis 520 and at least one driving gear 521 may be rotatable with respect to the first gear housing 522 by the motor 461. According to an embodiment, a part of the first gear housing 522 facing the cover housing 530 may be opened. For example, in a case of the cylindrical first gear housing 522, at least a part of an area facing the cover housing 530 among a circumferential surface of the first gear housing 522 may be opened. For another example, in a case of the rectangular first gear housing 522, one surface of the first gear housing 522 facing the cover housing 530 may be opened. As one surface of the first gear housing 522 is opened, the gear of at least one connection gear set 541 in the cover housing 530 may be engaged with at least one driving gear 521 in the first gear housing 522.

According to an embodiment, at least one driving gear 521 may include a first driving gear 521a and a second driving gear 521b. The first driving gear 521a may be disposed at one end of the first axis 520 facing the motor 461. The second driving gear 521b may be disposed at another end of the first axis 520 facing the one end of the first axis 520 facing the motor 461. The second driving gear 521b may have a gear teeth number greater than the first driving gear 521a. For example, a situation in which one gear has a gear teeth number greater than the other gear may indicate that a gear teeth number formed in the one gear is greater than the gear teeth number formed in the other gear. For another example, a situation in which one gear has a gear teeth number greater than the other may indicate that the angular velocity of the one gear is less than the angular velocity of the other gear when the one gear and the other gear rotate while engaged with each other, and the above expression may be used in the same manner hereinafter unless otherwise stated. According to an embodiment, the second driving gear 521b may be spaced apart from the first driving gear 521a.

According to an embodiment, at least one connection gear set 541 may include a first connection gear set 542 disposed at one end of the second axis 540 facing the actuator 510 and a second connection gear set 543 disposed at the other end of the second axis 540 facing the one end of the second axis 540 facing the actuator 510. The second connection gear set 543 may be spaced apart from the first connection gear set 542.

According to an embodiment, when the switching structure 500 is in the gear-connected state, the first connection gear set 542 may be engaged with at least one driving gear 521, and the second connection gear set 543 may be engaged with at least one transmitting gear 551. For example, when the switching structure 500 is in the gear-connected state, at least one driving gear 521 may be rotated as the first axis 520 is rotated by the motor 461. By rotation of at least one driving gear 521, gears of the first connection gear set 542 engaged with at least one driving gear 521 may be rotated. When gears of the first connection gear set 542 are rotated, the second axis 540 may be rotated with respect to the cover housing 530. The gears of the second connection gear set 543 engaged with at least one transmitting gear 551 may rotate at least one transmitting gear 551 by rotating by the rotation of the second axis 540. The third axis 550 may rotate the pinion gear (e.g., the pinion gear 462 of FIGS. 4A and 4B) by rotating by at least one transmitting gear 551.

According to an embodiment, the first connection gear set 542 may include a first connection gear 542a and a second connection gear 542b distinct from the first connection gear 542a. For example, the second connection gear 542b may have gear teeth different from the first connection gear 542a. As another example, the second connection gear 542b may have the same gear teeth number as the first connection gear 542a. According to an embodiment, the second connection gear set 543 may include a third connection gear 543a and a fourth connection gear 543b distinct from the third connection gear 543a. For example, the fourth connection gear 543b may have gear teeth different from the third connection gear 543a. For another example, the fourth connection gear 543b may have the same gear teeth number as the third connection gear 543a.

According to an embodiment, the second gear housing 552 may support the third axis 550. The second gear housing 552 may be disposed in the first housing 410. The third axis 550 and at least one transmitting gear 551 may be coupled to the second gear housing 552. For example, the third axis 550 and at least one transmitting gear 551 may be rotatable with respect to the second gear housing 552. According to an embodiment, a part of the second gear housing 552 facing the cover housing 530 may be opened. For example, in the case of a cylindrical second gear housing 552, at least a portion of the circumferential surface of the second gear housing 552 facing the cover housing 530 may be opened. For example, in a case of the cylindrical second gear housing 552, at least a part of the area facing the cover housing 530 among the circumferential surfaces of the second gear housing 552 may be opened. For another example, in a case of the rectangular second gear housing 552, one surface of the second gear housing 552 facing the cover housing 530 may be opened. As a part of the second gear housing 552 is opened, the gears of at least one connection gear set 541 in the cover housing 530 may be engaged with at least one transmitting gear 551 in the second gear housing 552.

According to an embodiment, a part of the cover housing 530 facing the first gear housing 522 and the second gear housing 552 may be opened. For example, in the case of a cylindrical cover housing 530, at least a part of the area facing the first gear housing 522 and the second gear housing 552 among the circumferential surfaces of the cover housing 530 may be opened. For another example, in the case of a rectangular cover housing 530, one surface of the cover housing 530 may be opened, facing the first gear housing 522 and the second gear housing 552.

According to an embodiment, at least one transmitting gear 551 may include a first transmitting gear 551a disposed at one end of a third axis 550 facing the second driving gear 521b and a second transmitting gear 551b disposed at the other end of the third axis 550 facing the one end of the third axis 550 and having a gear teeth number smaller than the first transmitting gear 551.

According to an embodiment, when the switching structure 500 is in the first gear-connected state, the second connection gear 542b of the first connection gear set 542 may be engaged with the second driving gear 521b and the fourth connection gear 543b of the second connection gear set 543 may be engaged with the second transmitting gear 551b. When the first axis 520 is rotated by the motor 461 in case that the switching structure 500 is in the first gear-connected state, the second driving gear 521b may be rotated. The second connection gear 542b engaged with the second driving gear 521b may be rotated by the second driving gear 521b. The fourth connection gear 543b may be rotated by rotation of the second connection gear 542b. The second transmitting gear 551b engaged with the fourth connection gear 543b may be rotated by the fourth connection gear 543b to rotate the pinion gear 462.

According to an embodiment, when the switching structure 500 is in the second gear-connected state, the first connection gear 542a may be engaged with the first driving gear 521a, and the third connection gear 543a may be engaged with the first transmitting gear 551a. When the switching structure 500 is in the first gear-connected state in case that the first axis 520 is rotated by the motor 461, the first driving gear 521a may be rotated. The first connection gear 542a engaged with the first driving gear 521a may be rotated by the first driving gear 521a. The third connection gear 543a may be rotated by rotation of the first connection gear 542a. The first transmitting gear 551a engaged with the third connection gear 543a may rotate the pinion gear 462 by rotating by the third connection gear 543a.

The gear ratio of each of the first gear-connected state and the second gear-connected state of the switching structure 500 may be defined by each gear teeth number of at least one driving gear 521, at least one connection gear set 541, and/or at least one transmitting gear 551. For example, in the first gear-connected state of switching structure 500, the first gear ratio of switching structure 500 may be expressed as Equation 1 below.

[Equation 1]

$$\text{The first gear ratio} = \frac{(\text{gear teeth number of the second connection gear}) \times (\text{gear teeth number of the second transmitting gear})}{(\text{gear teeth number of the second driving gear}) \times (\text{gear teeth number of the fourth connection gear})}$$

For another example, in the second gear-connected state of the switching structure 500, the second gear ratio of the switching structure 500 may be expressed as Equation 2 below.

[Equation 2]

$$\text{The second gear ratio} = \frac{(\text{gear teeth number of the second driving gear}) \times (\text{gear teeth number of the first transmitting gear})}{(\text{gear teeth number of the first driving gear}) \times (\text{gear teeth number of the third connection gear})}$$

According to an embodiment, a gear ratio of the switching structure 500 in the second gear-connected state may be greater than a gear ratio of the switching structure 500 in the first gear-connected state. For example, in case that the gear teeth number of each of the first connection gear 542a, the second connection gear 542b, the third connection gear 543b, and the fourth connection gear 543b are the same, the gear teeth number of the second driving gear 521b is greater than the gear teeth number of the first driving gear 521a, and the gear teeth number of the first transmitting gear 551b is greater than the gear teeth number of the second transmitting gear 551b, the first gear ratio may be smaller than the second gear ratio. As the gear ratio of the switching structure 500 in the second gear-connected state is greater than the gear ratio of the switching structure 500 in the first gear-connected state, the driving force of the pinion gear 462 in the second gear-connected state may be greater than the driving force of the pinion gear 462 in the first gear-connected state.

According to an embodiment, when the switching structure 500 is in a gear-released state, engagement of the gears of the first connection gear set 542 and at least one driving gear 521 may be released, and engagement of the gears of the second connection gear set 543 and at least one transmitting gear 551 may be released.

According to an embodiment, the state of the switching structure 500 may be changed based on the moving distance and direction of the actuator 510. For example, when the switching structure 500 is in the gear-released state, as the actuator 510 moves by the first designated distance in the third direction (e.g., the +x direction) toward the pinion gear 462, the switching structure 500 may be changed to the first gear-connected state. For another example, when the switching structure 500 is in a gear-released state, as the actuator 510 moves by the second designated distance in the fourth direction (e.g., the −x direction) toward the motor 461, the switching structure 500 may be changed to the second gear-connected state.

According to an embodiment, the processor (e.g., processor 470 of FIG. 4C) may be configured to identify whether the state change of the switching structure 500 is completed, based on identifying the moving distance of the actuator 510 after driving the actuator 510. The processor 470 may drive the actuator 510 in response to receiving a signal for changing the state of the switching structure 500. The processor 470 may identify whether the moving distance of the actuator 510 corresponds to the designated distance based on receiving data related to driving of the actuator 510 after driving the actuator 510. For example, the processor 470 may obtain data related to the driving of the actuator 510 through an encoder of the actuator 510, or data related to the driving of the actuator 510 through a phase change of the current received in the driving integrated circuit of the actuator 510. For example, the processor 470 may drive the actuator 510 based on receiving a signal for changing the state of switching structure 500 from the gear-released state to the first gear-connected state. In order for the state of the switching structure 500 to change from the gear-released state to the first gear-connected state, the actuator 510 may have to move in the third direction (e.g., the +x direction) by a distance corresponding to the first designated distance. The processor 470 may identify that the state change of the switching structure 500 is incomplete based on identifying that the moving distance of the actuator 510 identified through data related to the driving of the actuator 510 is less than the first designated distance. For example, in a state that at least one driving gear 521 and at least one gear of the first connection gear set 542 are misaligned, when the actuator 510 moves in the third direction, at least one driving gear 521 and at least one gear of the first connection gear set 542 may be not engaged with each other and may collide. As at least one driving gear 521 collides with the first connection gear set 542, the actuator 510 may not move by the designated distance. When the moving distance of the actuator 510 is less than the designated distance, the processor 470 may identify at least one driving gear 521 and at least one gear of the first connection gear set 542 as misaligned.

According to an embodiment, the processor 470 may be configured to align at least one driving gear 521 and at least one of the first connection gear set 542 through the motor 461 so that at least one gear of the first connection gear set 542 be engaged with at least one driving gear 521, based on identifying that the moving distance of actuator 510 is less than the designated distance. For example, the processor 470 may be configured to rotate the motor 461 at a designated angle based on identifying that the moving distance of the actuator 510 is less than the designated distance. At least one driving gear 521 connected to the second axis 520 may be rotated by rotation of the motor 461. When at least one driving gear 521 rotates, the gear teeth of at least one driving gear 521 may be aligned to be able to be engaged with gear teeth of the first connection gear set 524. After alignment of at least one driving gear 521 with the first connection gear set 524, the processor 470 may retry the state change of the switching structure 500 through the actuator 510. When the state change of switching structure 500 is re-identified as incomplete, the processor 470 may re-perform an operation of aligning at least one driving gear 521 and at least one gear of the first connection gear set 524 through the motor 461.

Based on when the state of the switching structure 500 is changed from the gear-released state to the first gear-connected state, the operation of the processor 470 for aligning the gears of the at least one driving gear 521 and the first connection gear set 524 described above has been described, but this is for convenience of explanation. The above-described operation of the processor 470 may be applied substantially the same when the state of the switching structure 500 is changed from a gear-released state to a second gear-connected state.

According to an embodiment, the first connection gear set 542 may include a first magnet 544 disposed on one surface of the first connection gear 542a or the second connection gear 542b facing at least one driving gear 521. For example, the first magnet 544 may be disposed on one surface of the second connection gear 542b facing the second driving gear 521b. According to an embodiment, at least one driving gear 521 may include a second magnet 523 facing the first magnet 544. For example, the second magnet 523 may be disposed on one surface of the second driving gear 521b facing the second connection gear 542b. The first magnet 544 and the second magnet 523 may align at least one of the gears among the at least one driving gear 521 and the gears of the first connection gear set 542 by interacting with each other. For example, in the first magnet 544 and the second magnet 523 in which surfaces having the same polarity face each other, at least one of the gears of the driving gear 521 and the first connection gear set 542 may be aligned, by applying a repulsive force to each other when at least one driving gear 521 and the first connection gear set 542 are misaligned. For another example, in the first magnet 544 and the second magnet 523 in which surfaces having different polarities face each other, at least one of the gears of the driving gear 521 and the first connection gear set 542 may be aligned, by applying an attractive force to each other when at least one driving gear 521 and the first connection gear set 542 are misaligned.

FIG. 5C illustrates that the first magnet 544 and the second magnet 523 are disposed in the second connection gear 542b and the second driving gear 521b, respectively, but are not limited thereto. For example, the first magnet 544 and the second magnet 523 may be disposed in the first connection gear 542a and the first driving gear 521a, respectively. As another example, the first magnet 544 and the second magnet 523 may be disposed in the second connection gear set 543 and at least one transmitting gear 551, respectively.

As described above, according to an embodiment, the electronic device (e.g., the electronic device 400 of FIGS. 4A, 4B, and 4C) may provide a structure capable of stably expanding or contracting the display (e.g., the display 430 of FIGS. 4A, 4B, and 4C) in various environments by the switching structure 500 whose state may be changed by the movement of the actuator 510. The electronic device 400 according to an embodiment may stably change the state of the switching structure 500 by a processor 470 capable of aligning at least one driving gear 521 and the first connection gear set 542.

Figure 6A:
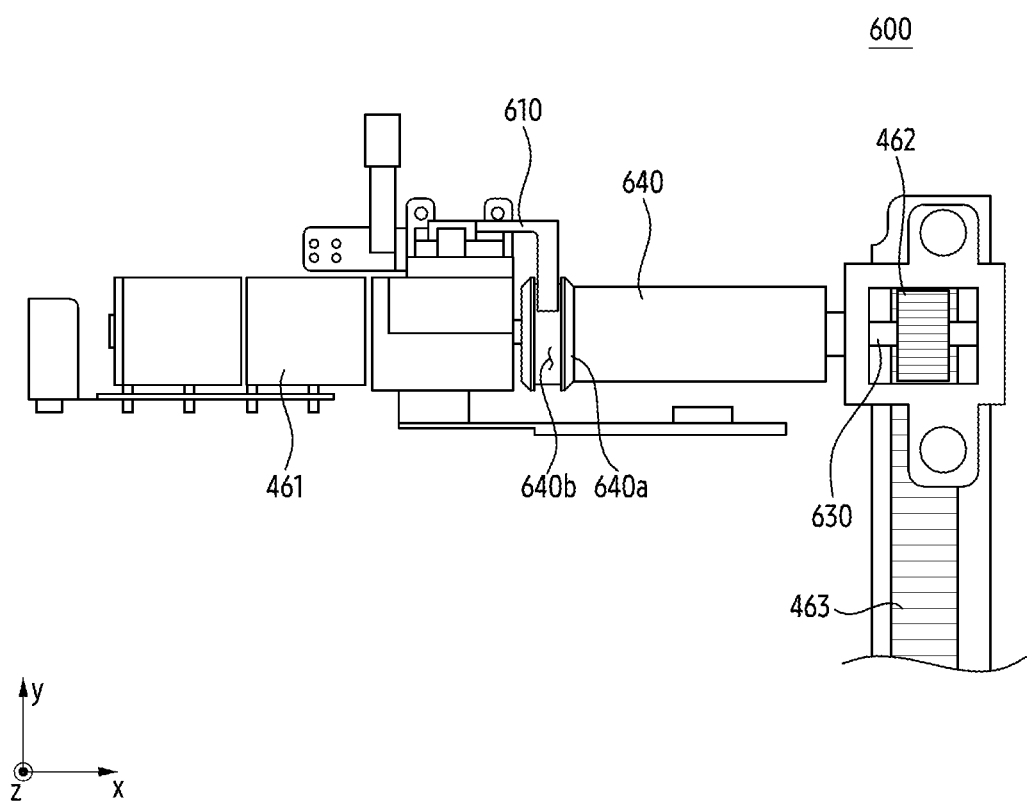
FIG. 6A illustrates a switching structure and a driving part of an electronic device according to an example embodiment.
Figure 6B:
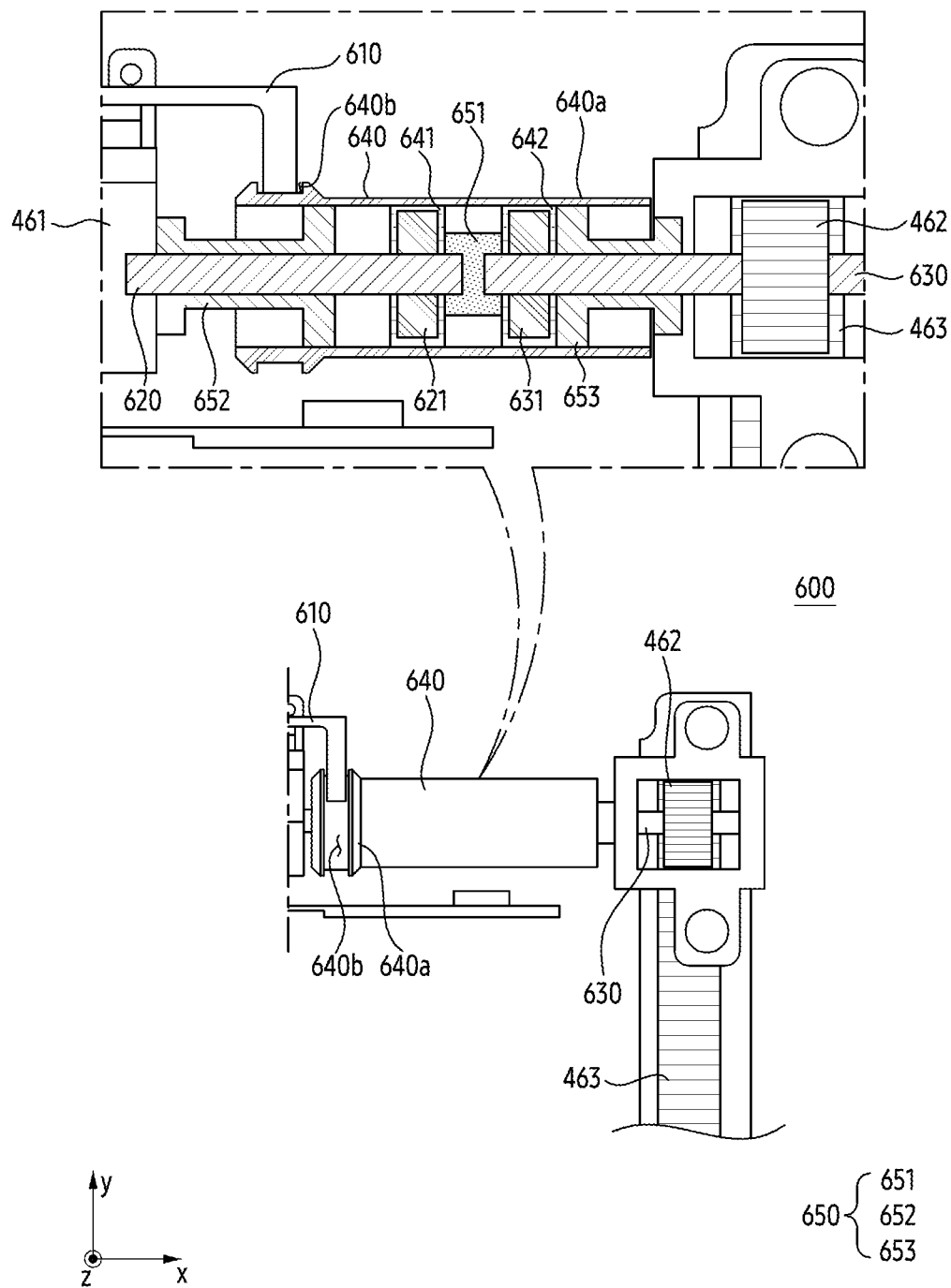
FIG. 6B is a cross-sectional view illustrating the inside of a switching structure and a driving part of an electronic device according to an example embodiment.
Figure 6C:
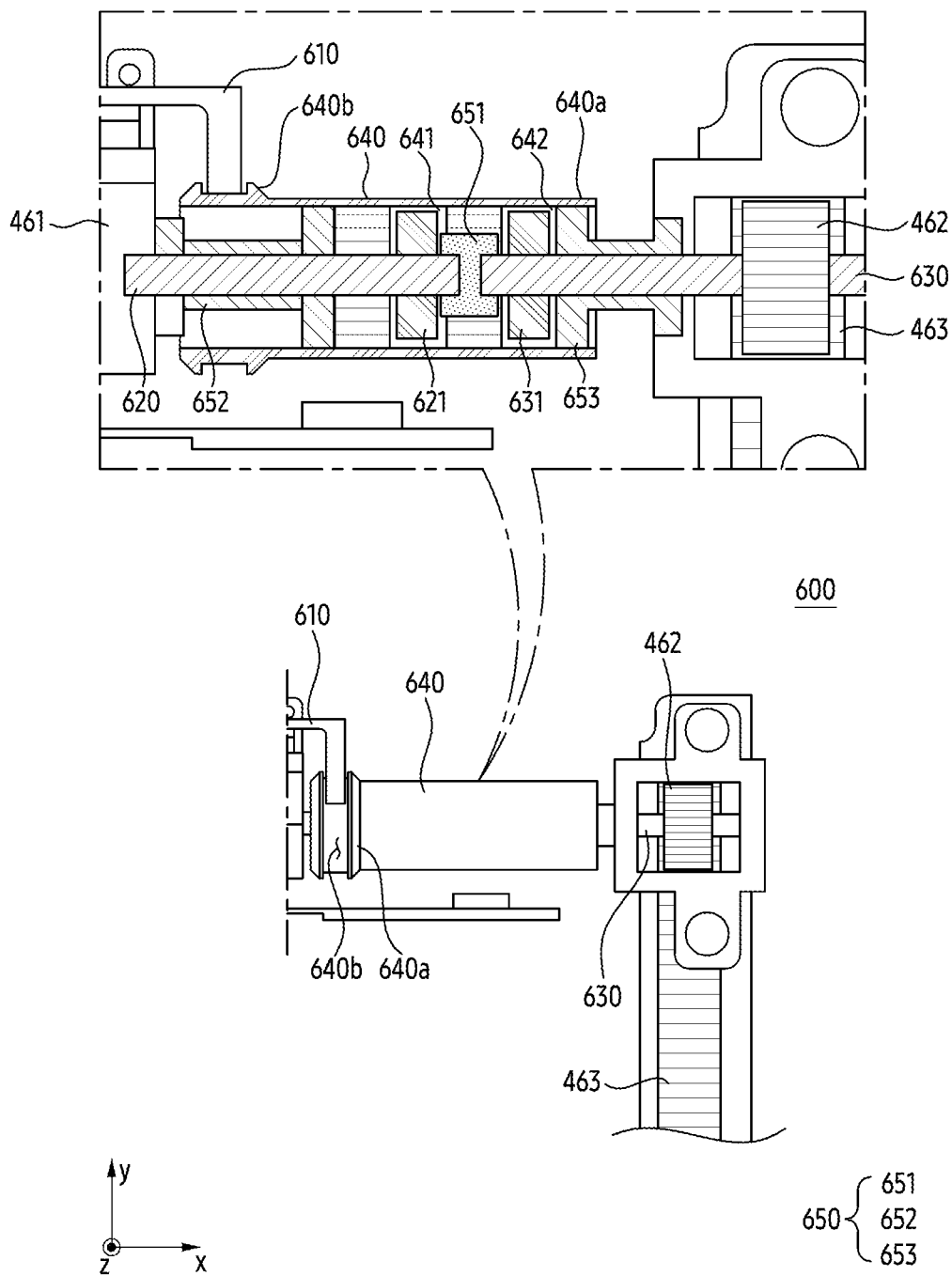
FIG. 6C is a cross-sectional view illustrating the inside of a switching structure and a driving part of an electronic device according to an example embodiment.

FIG. 6A illustrates a switching structure and a driving unit of an electronic device according to an embodiment, FIG. 6B is a cross-sectional view illustrating the inside of a switching structure and a driving unit of an electronic device according to an embodiment, and FIG. 6C is a cross-sectional view illustrating the inside of a switching structure and a driving unit of an electronic device according to an embodiment.

Referring to FIGS. 6A, 6B, and 6C, the electronic device (e.g., the electronic device 400 of FIGS. 4A, 4B, and 4C) according to an embodiment may further include a switching structure 600. The electronic devices 400 of FIGS. 6A, 6B, and 6C may be the electronic devices 400 in which the structures of the switching structure 500 in the electronic devices 400 of FIGS. 4A, 4B, and 4C are changed, and thus a repeated description thereof will be omitted.

According to an embodiment, the switching structure 600 may be disposed between a motor 461 and a pinion gear 462. According to an embodiment, the switching structure 600 may be changed to a gear-connected state in which the motor 461 and the pinion gear 462 are connected or a gear-released state in which the motor 461 and the pinion gear 462 are disconnected.

According to an embodiment, the switching structure 600 may include an actuator 610, a first axis 620, a second axis 630, a cover housing 640, and at least one bearing 650. The actuators 610 of FIGS. 6A, 6B, and 6C may be substantially the same as the actuators 510 of FIGS. 4A, 4B, and 4C, and thus repeated descriptions thereof will be omitted.

According to an embodiment, the actuator 610 may be movable in a third direction (e.g., +x direction), which is a direction toward the pinion gear 462, or a fourth direction (e.g., −x direction), which is a direction toward the motor 461. The actuator 610 may be coupled to the cover housing 640 to move the cover housing 640.

According to an embodiment, one end of the first axis 620 may be coupled to the motor 461 to be rotatable by the motor 461. For example, the one end of the first axis 620 may be inserted into the motor 461. According to an embodiment, the driving gear 621 may be coupled to the first axis 620. When the first axis 620 is rotated by the motor 461, the driving gear 621 may be rotated together with the first axis 620.

According to an embodiment, the second axis 630 may be spaced apart from the first axis 620, and one end of the second axis 630 may be coupled to the pinion gear 462. For example, a part of the second shaft axis 630 may penetrate the pinion gear 462. According to an embodiment, the transmitting gear 631 may be coupled to the second axis 630. When the second axis 630 is rotated by the rotation of the transmitting gear 631, the pinion gear 462 may be rotated. By the rotation of the pinion gear 462, the rack gear 463 may be movable in a first direction (e.g., the +y direction) or a second direction (e.g., the −y direction) opposite to the first direction.

According to an embodiment, the cover housing 640 may accommodate at least a part of components of the switching structure 600. The cover housing 640 may surround at least a part of the first axis 620 and the second axis 630. The driving gear 621 coupled to the first axis 620 and the transmitting gear 631 coupled to the second axis 630 may be surrounded by the cover housing 640. According to an embodiment, the cover housing 640 may be movable by the actuator 610. For example, the cover housing 640 may be movable in a third direction (e.g., +x direction) toward the pinion gear or a fourth direction (e.g., −x direction) toward the motor 461 by the actuator 610. According to an embodiment, the cover housing 640 may include a coupling groove 640b formed by denting at least a part of the outer surface 640a along the circumference of the outer surface 640a of the cover housing 640. A part of the actuator 610 may be accommodated in the coupling groove 640b. Since the coupling groove 640b is formed along the circumference of the cover housing 640, the cover housing 640 may be rotatable with respect to the actuator 610.

According to an embodiment, the cover housing 640 may include a first ring gear 641 disposed on the inner surface of the cover housing 640, and a second ring gear 642 spaced apart from the first ring gear 641. The second ring gear 642 may be spaced apart from the first ring gear 641 in a third direction parallel to the first axis 620. According to an embodiment, the first ring gear 641 may be engaged with the driving gear 621 when the switching structure 600 is in a gear-connected state, and may be spaced apart from the driving gear 621 when the switching structure 600 is in a gear-released state. According to an embodiment, the second ring gear 642 may be engaged with the transmitting gear 631 when the switching structure 600 is in the gear-connected state, and may be spaced apart from the transmitting gear 631 when the switching structure 600 is in the gear-released state.

According to an embodiment, at least one bearing 650 may include a first bearing 651, a second bearing 652, and a third bearing 653. The first bearing 651 may be disposed in the cover housing 640 and may support the first axis 620 and the second axis 630 within the cover housing 640. According to an embodiment, the first bearing 651 may surround another end of the first axis 620 spaced apart from the motor 461 and another end of the second axis 630 spaced apart from the pinion gear 462. The first bearing 651 may be rotatable independently of the first axis 620 and the second axis 630. For example, the first bearing 651 may rotate independently to the first axis 620 and the second axis 630 without transmitting the driving force of the first axis 620 to the second axis 630.

According to an embodiment, the second bearing 652 may support the first axis 620 and a part of the cover housing 640 facing the motor 461. The second bearing 652 may be disposed between the motor 461 and the first ring gear 641. The second bearing 652 may surround at least a portion of the first axis 620 and may be rotatable independently to the first axis 620. According to an embodiment, the size of the one end of the second bearing 651 facing the motor 461 may be smaller than the size of the other end of the second bearing 651 disposed in the cover housing 640. For example, the size of the other end of the second bearing 651 may correspond to the inner diameter of the cover housing 640.

According to an embodiment, the third bearing 653 may support a part of the cover housing 640 facing the second axis 630 and the pinion gear 462. The third bearing 653 may be disposed between the second ring gear 642 and the pinion gear 462. The third bearing 653 may surround at least a part of the second axis 630 and may be rotatable independently to the second axis 630. According to an embodiment, the size of the one end of the third bearing 653 facing the pinion gear 462 may be smaller than the size of the other end of the third bearing 653 disposed in the cover housing 640. For example, the size of the other end of the third bearing 653 may correspond to the inner diameter of the cover housing 640.

According to an embodiment, the state of the switching structure 600 may be changed to the gear-released state or the gear-connected state according to the movement of the actuator 610. For example, in case that the switching structure 600 is in the gear-connected state, when the cover housing 640 moves in a fourth direction (e.g., the −x direction), which is a direction toward the motor 461 by the actuator 610, the switching structure 600 may be changed to the gear-released state. For example, when the switching structure 600 is in the gear-connected state, the first ring gear 641 may be engaged with the driving gear 621, and the second ring gear 642 may be engaged with the transmitting gear 631. When the cover housing 640 is moved in the fourth direction by the actuator 610, the first ring gear 641 and the second ring gear 642 may move in the fourth direction and be spaced apart from the driving gear 621 and the transmitting gear 631, respectively. As the first ring gear 641 and the second ring gear 642 are respectively spaced apart from the driving gear 621 and the transmitting gear 631, the state of the switching structure 600 may be changed to the gear-released state. According to an embodiment, in the gear-released state of the switching structure 600, since the driving force by the rotation of the first axis 620 is not transmitted to the cover housing 640 as the first ring gear 641 and the driving gear 621 are separated, the cover housing 640 may not rotate. When the switching structure 600 is in the gear-released state, the driving gear 621 may be disposed between the first ring gear 641 and the second ring gear 642.

According to an embodiment, in case that the switching structure 600 is in a gear-released state, when the cover housing 640 is moved in a third direction (e.g., +x direction), which is a direction toward the pinion gear 462 by the actuator 610, the switching structure 600 may be changed to the gear-connected state. When the switching structure 600 is in the gear-released state, the first ring gear 641 may be spaced apart from the driving gear 621, and the second ring gear 642 may be spaced apart from the transmitting gear 631. When the cover housing 640 moves in the third direction, the first ring gear 641 and the second ring gear 642 may move in the third direction to engage the driving gear 621 and the transmitting gear 631, respectively. As the first ring gear 641 and the second ring gear 642 engage with the driving gear 621 and the transmitting gear 631, respectively, the state of the switching structure 600 may be changed to the gear-connected state. According to an embodiment, in the gear-connected state of the switching structure 600, when the first axis 620 is rotated by the motor 461, the driving gear 621 coupled to the first axis 620 may be rotated. The first ring gear 641 engaged with the driving gear 621 may be rotated by the driving gear 621, so that the cover housing 640 and the second ring gear 642 may be rotated with respect to the actuator 610. The transmitting gear 631 engaged with the second ring gear 642 may be rotated by the second ring gear 642. The second axis 630 may be rotated by the transmitting gear 631, and the pinion gear 462 may be rotated by the rotation of the second axis 630 to move the rack gear 463.

According to an embodiment, the state of the switching structure 600 may be changed based on the moving distance and direction of the actuator 610. For example, when switching structure 600 is in the gear-released state, as the actuator 610 moves by the first designated distance in the third direction (e.g., the +x direction) toward the pinion gear 463, the switching structure 600 may be changed to the gear-connected state. For another example, when switching structure 600 is in the gear-connected state, as the actuator 610 moves by the second designated distance in the fourth direction (e.g., the −x direction) toward the motor 461, the switching structure 500 may be changed to the gear-released state.

According to an embodiment, the processor (e.g., processor 470 of FIG. 4C) may be configured to identify whether the state change of the switching structure 600 is completed based on identifying the moving distance of actuator 610 after driving the actuator 610. The processor 470 may drive the actuator 610 in response to receiving a signal for changing the state of the switching structure 600. The processor 470 may identify whether the moving distance of the actuator 610 corresponds to the designated distance based on receiving data related to driving of the actuator 610 after driving the actuator 610. For example, the processor 470 may obtain data related to the driving of the actuator 610 through an encoder of the actuator 610, or data related to driving of the actuator 610 through a phase change of the current received in the driving integrated circuit of the actuator 610. For example, in order for the state of switching structure 600 to change from the gear-released state to the gear-connected state, the actuator 610 may have to move by the first designated distance in the third direction. When the actuator 610 moves in the third direction while the driving gear 621 and the first ring gear 641 are misaligned, the driving gear 621 and the first ring gear 641 may be not engaged with each other and may collide. As the driving gear 621 collides with the first ring gear 641, the actuator 610 may not move by the designated distance. The processor may identify that the driving gear 621 and the first ring gear 641 are misaligned based on identifying that the moving distance of the actuator 610 is less than the designated distance.

According to an embodiment, based on identifying the moving distance of the actuator 610 is less than the designated distance, the processor 470 may be configured to align the driving gear 621 and the first ring gear 641 through the motor 461 so that the driving gear 621 and the first ring gear 641 engaged with each other. For example, the processor 470 may be configured to rotate motor 461 at a designated angle based on identifying that the moving distance of actuator 610 is less than the designated distance. When the driving gear 621 is rotated by the motor 461, the gear teeth of the driving gear 621 may be aligned to be engaged with the gear teeth of the first ring gear 641. After alignment of the driving gear 621 and the first ring gear 641, the processor 470 may retry changing the state of the switching structure 600 through the actuator 610. When the state change of the switching structure 600 is re-identified as incomplete, the processor 470 may re-perform the driving gear 621 and the first ring gear 641 through the motor 461.

As described above, according to an embodiment, the electronic device 400 may provide a structure capable of manually expanding or contracting a display (e.g., the display 430 of FIGS. 4A, 4B, and 4C) without damaging a component of the electronic device 400 by the switching structure 600 capable of connecting or releasing the motor 461 and the pinion gear 462. The electronic device 400 according to an embodiment may stably change the state of the switching structure 600 by the processor 470 capable of aligning the driving gear 621 and the first ring gear 641.

Figure 7A:
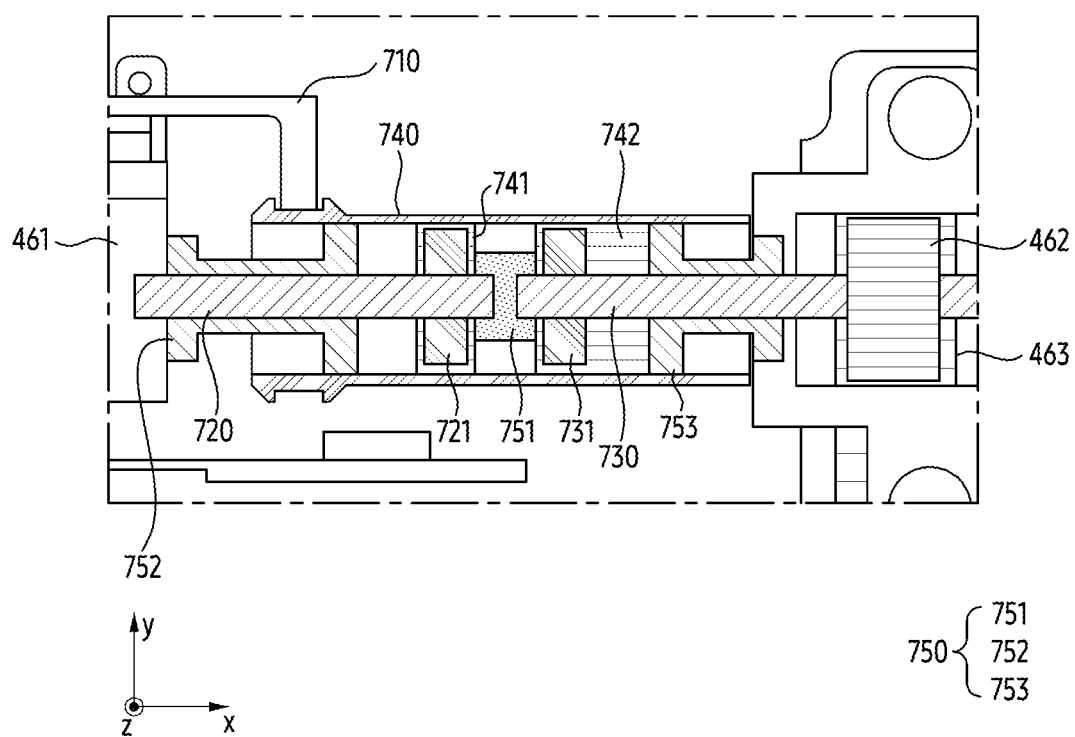
FIG. 7A is a cross-sectional view illustrating a gear-connected state of a switching structure of an electronic device according to an example embodiment.
Figure 7B:
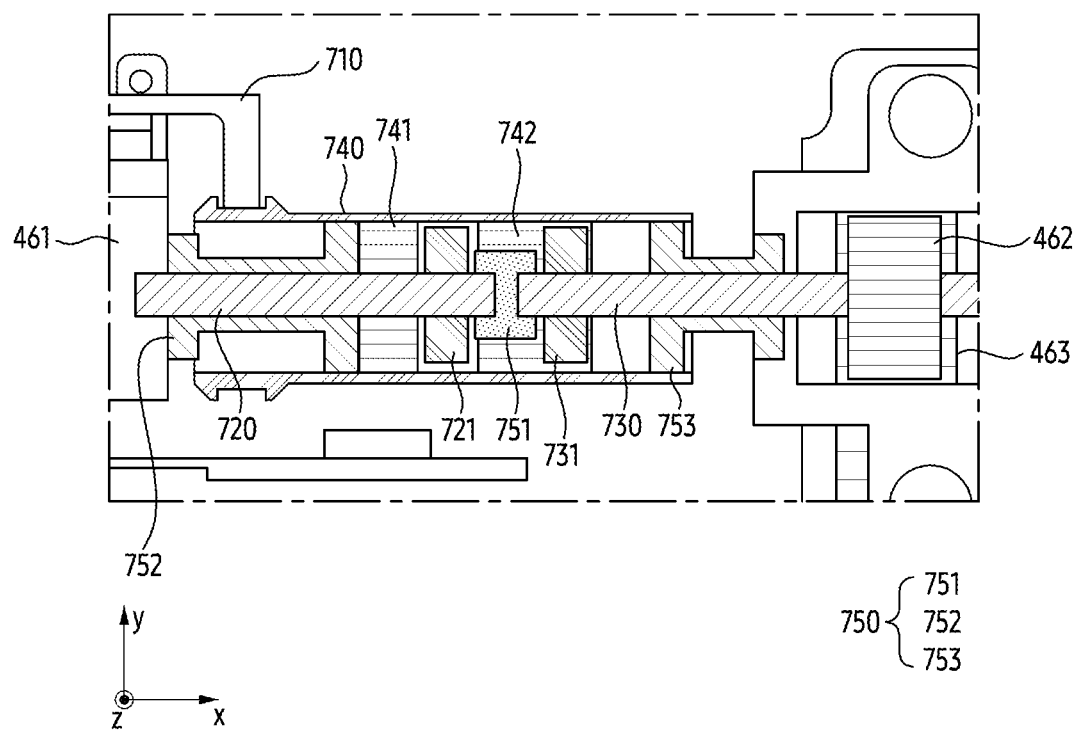
FIG. 7B is a cross-sectional view illustrating a gear-connected state of a switching structure of an electronic device according to an example embodiment.

FIG. 7A is a cross-sectional view illustrating a gear-connected state of a switching structure of an electronic device according to an embodiment, and FIG. 7B is a cross-sectional view illustrating a gear-connected state of a switching structure of an electronic device according to an embodiment.

Referring to FIGS. 7A and 7B, an electronic device (e.g., the electronic device 400 of FIGS. 4A, 4B, and 4C) according to an embodiment may include a switching structure 700. Since the switching structure 700 of FIGS. 7A and 7B may be a switching structure 700 in which the structure of the second ring gear 642 is changed in the switching structure 600 of FIGS. 6A, 6B, and 6C, and thus repeated descriptions thereof will be omitted.

According to an embodiment, the switching structure 700 may include an actuator 710, a first axis 720, a second axis 730, a cover housing 740, and at least one bearing 750. The actuator 710, the first axis 720, the second axis 730, the cover housing 740, and at least one bearing 750 in FIGS. 7A and 7B may be substantially the same as the actuators 610 in FIGS. 6A, 6B, and 6C, the first axis 620, the second axis 630, the cover housing 640, and at least one bearing 650, respectively, and thus repeated descriptions thereof will be omitted.

According to an embodiment, the actuator 710 may be movable in a third direction (e.g., +x direction), which is a direction toward the pinion gear 462, or a fourth direction (e.g., −x direction), which is a direction toward the motor 461. The actuator 710 may be coupled to the cover housing 740 to move the cover housing 740.

According to an embodiment, the first axis 720 may be rotatable by the motor 461 as the one end of the first axis 720 is coupled to the motor 461. For example, the one end of the first axis 720 may be inserted into the motor 461. According to an embodiment, the driving gear 721 may be coupled to the first axis 720. When the first axis 720 is rotated by the motor 461, the driving gear 721 may be rotated together with the first axis 720.

According to an embodiment, the second axis 730 may be spaced apart from the first axis 720, and one end of the second axis 730 may be coupled to the pinion gear 462. For example, a part of the second axis 730 may penetrate the pinion gear 462. According to an embodiment, the transmitting gear 731 may be coupled to the second axis 730. When the second axis 730 is rotated by the rotation of the transmitting gear 731, the pinion gear 462 may be rotated. By the rotation of the pinion gear 462, the rack gear 463 may be movable in a first direction (e.g., the +y direction) or a second direction (e.g., the −y direction) opposite to the first direction.

According to an embodiment, the cover housing 740 may accommodate at least a part of the components of the switching structure 700. The cover housing 740 may surround at least a part of the first axis 720 and the second axis 730. The driving gear 721 coupled to the first axis 720 and the transmitting gear 731 coupled to the second axis 730 may be surrounded by the cover housing 740. According to an embodiment, the cover housing 740 may be movable by the actuator 710. For example, the cover housing 740 may be movable in a third direction (e.g., +x direction) toward the pinion gear by the actuator 710 or a fourth direction (e.g., −x direction) toward the motor 471. According to an embodiment, the cover housing 740 may include a first ring gear 741 disposed on the inner surface of the cover housing 740 and a second ring gear 742 spaced apart from the first ring gear 741. The second ring gear 742 may be spaced apart from the first ring gear 741 in a third direction parallel to the first axis 720. According to an embodiment, the first ring gear 741 may be engaged with the driving gear 721 when the switching structure 700 is in the gear-connected state, and may be spaced apart from the driving gear 721 when the switching structure 700 is in the gear-released state. According to an embodiment, the second ring gear 742 may be engaged with the transmitting gear 731 when the switching structure 700 is in the gear-released state and in the gear-connected state. For example, the second ring gear 742 may maintain an engaged state with the transmitting gear 731, regardless of the state of the switching structure 700.

According to an embodiment, at least one bearing 750 may include a first bearing 751, a second bearing 752, and a third bearing 753. According to an embodiment, the first bearing 751 may surround another end of the first axis 720 spaced apart from the motor 471 and another end of the second axis 730 spaced apart from the pinion gear 472. The first bearing 751 may be rotatable independently to the first axis 720 and the second axis 730. According to an embodiment, the second bearing 752 may be disposed between the motor 471 and the first ring gear 741. The second bearing 752 may surround at least a part of the first axis 720 and may be rotatable independently to the first axis 720. According to an embodiment, the third bearing 753 may be disposed between the second ring gear 742 and the pinion gear 472. The third bearing 753 may surround at least a part of the second axis 730 and may be rotatable independently to the second axis 730.

According to an embodiment, when the switching structure 700 is in the gear-connected state, as the actuator 710 moves in the fourth direction (e.g., the −x direction), which is a direction toward the motor 461, the switching structure 700 may be changed to a gear-released state. For example, when the switching structure 700 is in the gear-connected state, the first ring gear 741 may be engaged with the driving gear 721, and the second ring gear 742 may be engaged with the transmitting gear 731. When the cover housing 740 is moved in the fourth direction by the actuator 710, the first ring gear 741 may move in the fourth direction and be spaced apart from the driving gear 721. The second ring gear 742 may move in the fourth direction while maintaining an engaged state with the transmitting gear 731. When the switching structure 700 is in the gear-released state, as the motor 461 rotates, the first axis 720 and the driving gear 721 may rotate. As the driving gear 721 and the first ring gear 741 are spaced apart from each other, the cover housing 740 may not be rotated by the driving gear 721. When the cover housing 740 does not rotate, the pinion gear 462 may not rotate because the driving force of the first axis 720 is not transmitted to the second axis 730.

According to an embodiment, when the switching structure 700 is in the gear-released state, as the actuator 710 moves in a third direction (e.g., +x direction), which is a direction toward the pinion gear 462, the switching structure 700 may be changed to the gear-connected state. For example, when the switching structure 700 is in the gear-released state, the first ring gear 741 may be spaced apart from the driving gear 721, and the second ring gear 742 may be engaged with the transmitting gear 731. When the cover housing 740 is moved in the third direction by the actuator 710, the first ring gear 741 may move in the third direction and be engaged with the driving gear 721. The second ring gear 742 may move in the third direction while maintaining an engaged state with the transmitting gear 731. When the switching structure 700 is in the gear-connected state, as the motor 461 rotates, the first axis 720 and the driving gear 721 may rotate. The first ring gear 741 engaged with the driving gear 721 may be rotated by the driving gear 721. As the first ring gear 741 rotates, the cover housing 740 and the second ring gear 742 may rotate with respect to the actuator 710. The transmitting gear 731 engaged with the second ring gear 742 may rotate by rotation of the second ring gear 742 to rotate the second axis 730. The pinion gear 462 connected to the second axis 730 may be rotated by the second axis 730 to move the rack gear 463.

As described above, according to an embodiment, the electronic device 400 may provide a structure capable of manually expanding or contracting a display (e.g., the display 430 of FIGS. 4A, 4B, and 4C) without damaging a component of the electronic device 400 by the switching structure 700 capable of connecting or releasing the motor 461 and the pinion gear 462.

Figure 8:
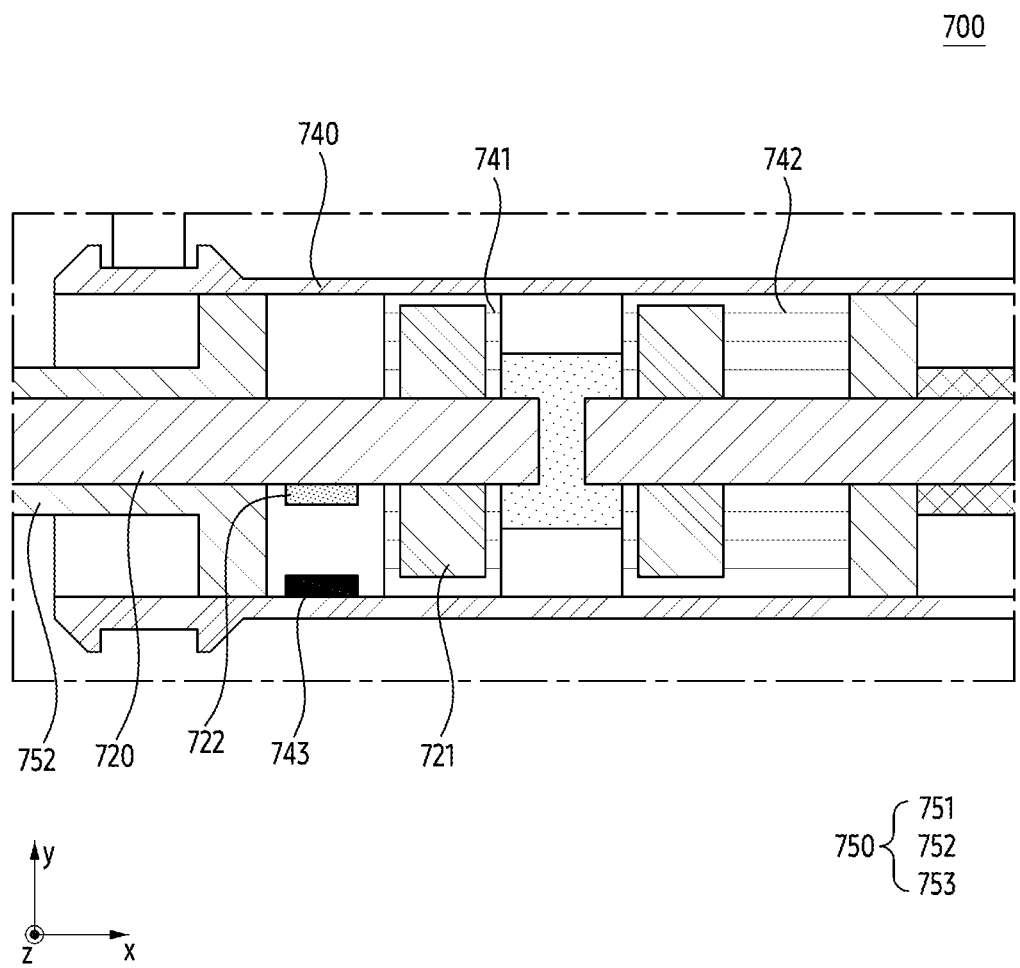
FIG. 8 is a cross-sectional view of a switching structure of an electronic device according to an example embodiment.

FIG. 8 is a cross-sectional view of a switching structure of an electronic device according to an embodiment.

Referring to FIG. 8, a cover housing 740 according to an embodiment may include a first magnet 743 disposed on an inner surface of the cover housing 740. The first magnet 743 may be spaced apart from a first ring gear 741. For example, the first magnet 743 may be disposed between a second bearing 752 and the first ring gear 741.

According to an embodiment, the switching structure 700 may further include a second magnet 722 disposed on the first axis 720. The second magnet 722 may align the first ring gear 741 and the driving gear 721 by interacting with the first magnet 743 disposed in the cover housing 740. For example, the second magnet 722 may align the first ring gear 741 and the driving gear 721, by applying an attractive force to the first magnet 743, so that the first ring gear 741 and the driving gear 721 are engaged with each other. For another example, the second magnet 722 may align the first ring gear 741 and the driving gear 721, by applying a repulsive force to the first magnet 743, so that the first ring gear 741 and the driving gear 721 are engaged with each other.

The first magnet 743 and the second magnet 722 of FIG. 8 are illustrated based on the switching structure 700 of FIGS. 7A and 7B, but are not limited thereto. For example, the first magnet 743 and the second magnet 722 may be disposed in the switching structure 600 of FIGS. 6A, 6B, and 6C.

As described above, according to an embodiment, the electronic devices (e.g., the electronic devices 400 of FIGS. 4A, 4B, and 4C) may provide a structure in which a state of the switching structure 700 may be stably changed by the first magnet 743 and the second magnet 722 which aligns the first ring gear 741 and the driving gear 721.

Figure 9A:
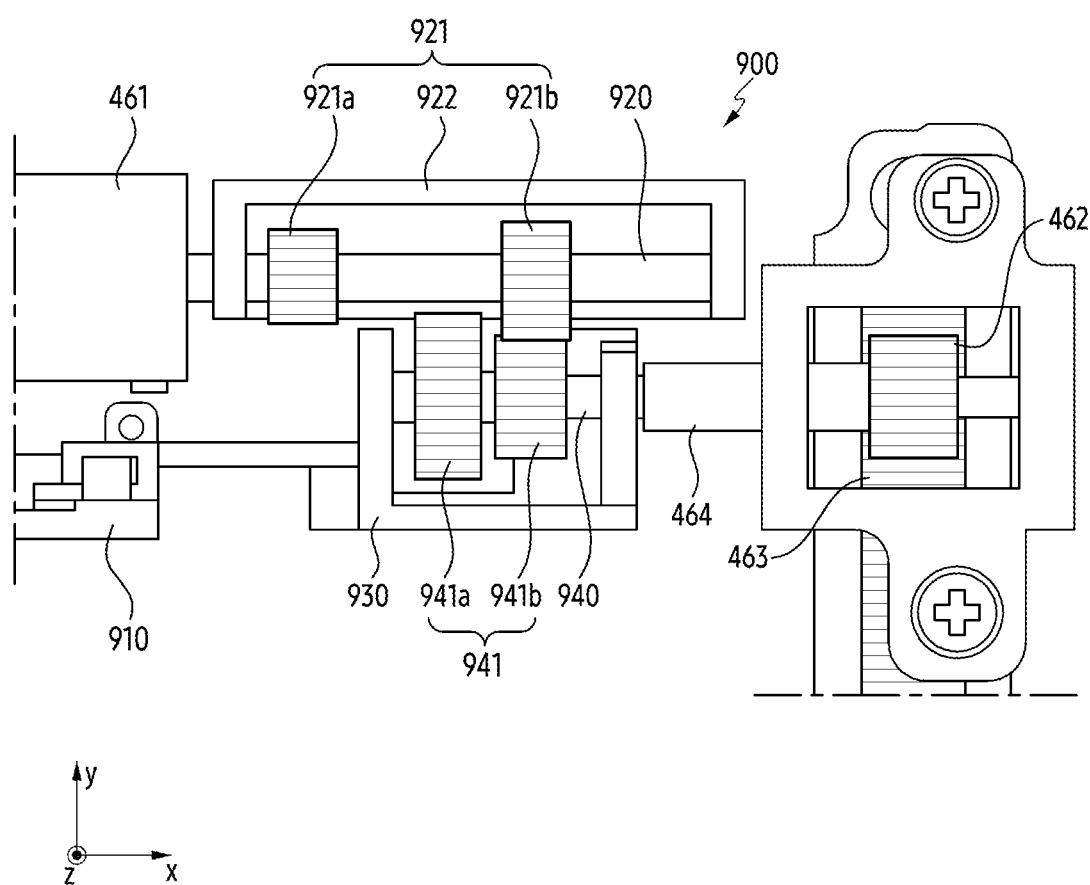
FIG. 9A illustrates a first gear-connected state of a switching structure of an electronic device according to an example embodiment.
Figure 9B:
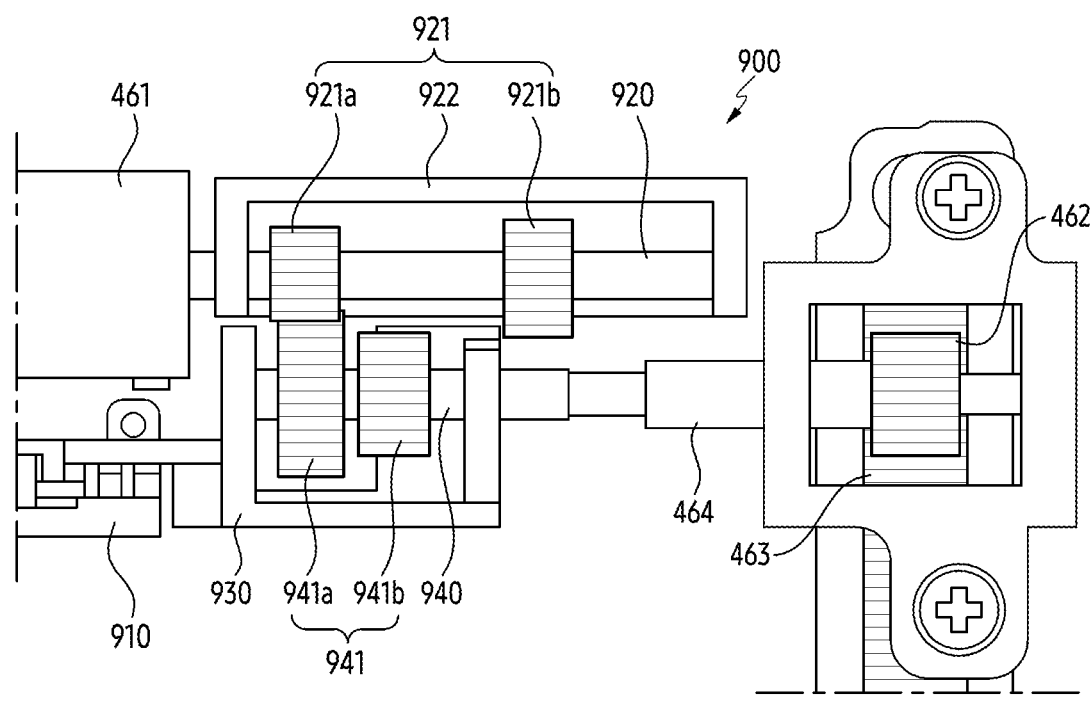
FIG. 9B illustrates a second gear-connected state of a switching structure of an electronic device according to an example embodiment.
Figure 9C:
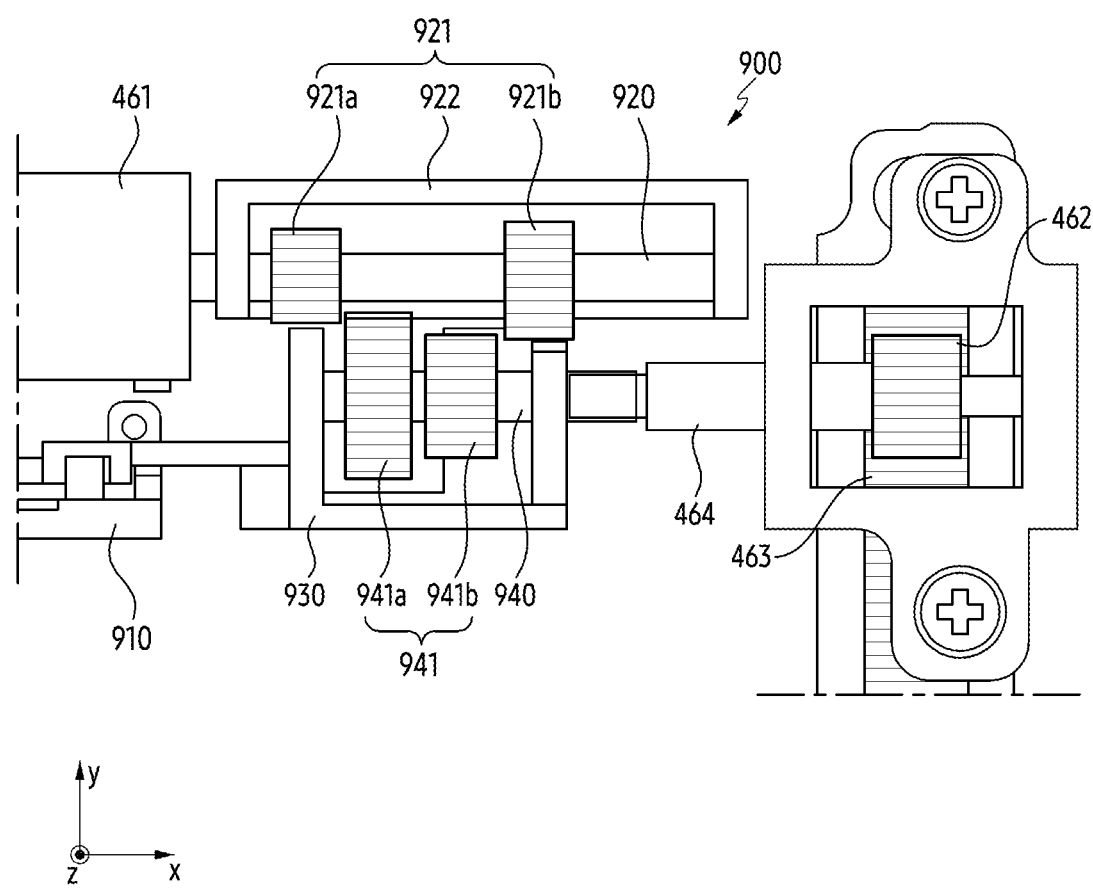
FIG. 9C illustrates a gear-released state of a switching structure of an electronic device according to an example embodiment.
Figure 9D:
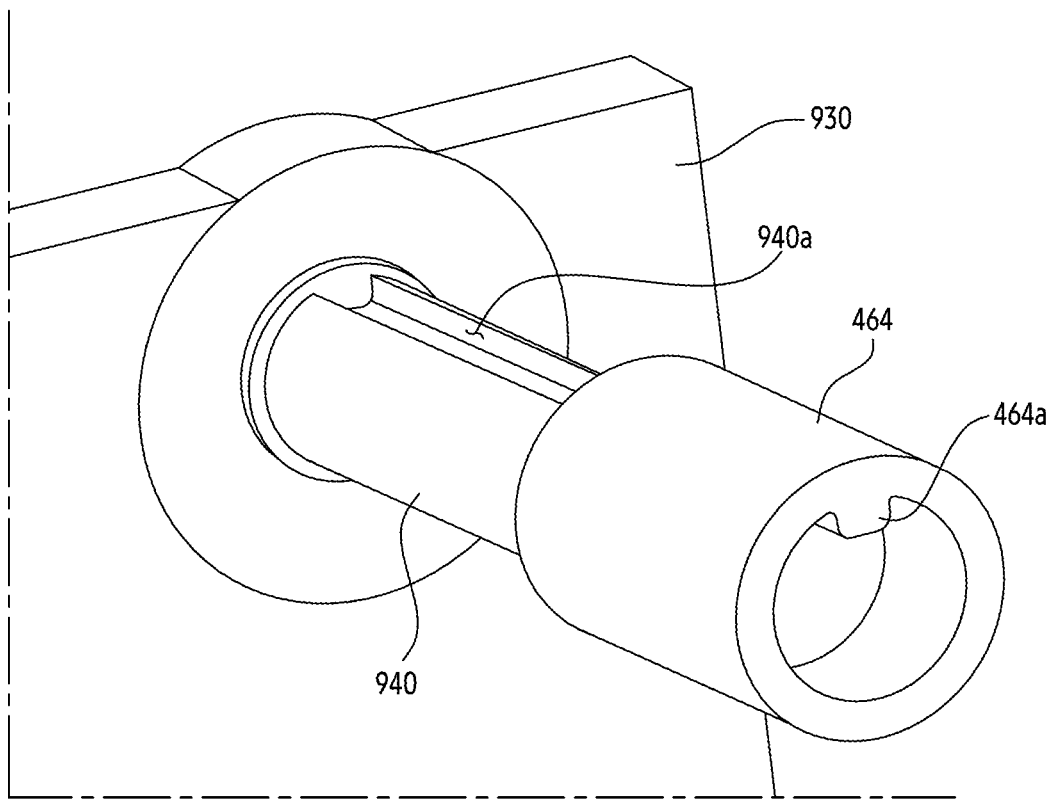
FIG. 9D is a partial perspective view illustrating a transmitting axis of an electronic device and a second axis of a switching structure according to an example embodiment.

FIG. 9A illustrates a first gear-connected state of a switching structure of an electronic device according to an embodiment, FIG. 9B illustrates a second gear-connected state of a switching structure of an electronic device according to an embodiment, FIG. 9C illustrates a gear-released state of a switching structure of an electronic device according to an embodiment, and FIG. 9D is a partial perspective view illustrating a transmitting axis of an electronic device and a second axis of a switching structure according to an embodiment.

Referring to FIGS. 9A, 9B, 9C, and 9D, an electronic device (e.g., the electronic device 400 of FIGS. 4A, 4B, and 4C) according to an embodiment may include a switching structure 900. The switching structure 900 of FIGS. 9A, 9B, and 9C may be substantially the same as the switching structure 500 of FIGS. 4A, 4B, and/or 4C, and thus a repeated description thereof will be omitted.

According to an embodiment, the switching structure 900 may include an actuator 910, a first axis 920, a first gear housing 922, a cover housing 930, and/or a second axis 940. Since the actuator 910, the first axis 920, and/or the cover housing 930 of FIGS. 9A, 9B, and 9C may be substantially the same as the actuator 510, the first axis 520, and/or the cover housing 530 of FIG. 4A and/or FIG. 4B, and thus repeated descriptions will be omitted. The first gear housing 922 of FIGS. 9A, 9B, and 9C may be substantially the same as the first gear housing 522 of FIGS. 5A, 5B, and/or 5C, and thus a repeated description will be omitted.

According to an embodiment, the actuator 910 may change the state of the switching structure 500. For example, the actuator 910 may be movable in a third direction (e.g., +x direction) from the motor 461 to the pinion gear 462 or a fourth direction (e.g., −x direction) from the pinion gear 462 to the motor 461.

According to an embodiment, the first axis 920 may be coupled to the motor 461 to be rotatable by the motor 461. For example, the one end of the first axis 920 may be inserted into the motor 461. According to an embodiment, at least one driving gear 921 may be coupled to the first shaft axis 920. For example, the first shaft axis 920 may penetrate at least one driving gear 921. At least one driving gear 921 may be rotatable according to rotation of the first axis 920. At least one driving gear 921 may transmit the driving force of the motor 461 to at least one transmitting gear 941.

According to an embodiment, at least one driving gear 921 may include a first driving gear 921a connected to one end of the first axis 920 facing the motor 461, and a second driving gear 921b spaced apart in the third direction from the first driving gear 921a. The second driving gear 921b may have a gear teeth number different from the first driving gear 921a. For example, the second driving gear 921b may have a gear teeth number greater than the first driving gear 921a.

According to an embodiment, the first gear housing 922 may surround the first axis 920 and at least one driving gear 921. A first axis 920 may penetrate the first gear housing 922 and may be rotatable with respect to the first gear housing 922 by the motor 461. According to an embodiment, a part of the first gear housing 922 facing the cover housing 930 may be opened. For example, when the cross section of the first gear housing 922 is quadrangular, one surface of the first gear housing 922 facing the cover housing 930 may be opened. For another example, when the cross section of the first gear housing 922 is circular, at least a portion of the area facing the cover housing 930 may be opened.

According to an embodiment, the cover housing 930 may be connected to the actuator 910 and may be movable in a direction parallel to the first axis 920 by the actuator 910. For example, the cover housing 930 may be movable in a third direction or a fourth direction opposite to the third direction by the actuator 910. According to an embodiment, the cover housing 930 may surround the second axis 940 and at least one transmitting gear 941. According to an embodiment, a part of the cover housing 930 facing the first gear housing 922 may be opened. For example, when the cross section of the cover housing 930 is quadrangular, one surface of the cover housing 930 facing the first gear housing 922 may be opened. For another example, when the cross section of the cover housing 930 is quadrangular, at least a part of the area facing the first gear housing 922 may be opened.

According to an embodiment, the second axis 940 may be coupled to the cover housing 930 to be rotatable with respect to the cover housing 930. For example, the second axis 940 may penetrate the cover housing 930. According to an embodiment, at least one transmitting gear 941 may be coupled to the second axis 940. The second axis 940 may be rotatable by rotation of at least one transmitting gear 941. The second axis 940 may be rotated by the at least one transmitting gear 941 to rotate the pinion gear 462. According to an embodiment, the second axis 940 may be movable in the third direction or the fourth direction opposite to the third direction by the actuator 910.

According to an embodiment, at least one transmitting gear 941 may include a first transmitting gear 941a coupled to one end of the second axis 940 facing the motor 461, and a second transmitting gear 941b spaced apart from the first transmitting gear 941a in the third direction. The second transmitting gear 941b may have a gear teeth number different from the first driving gear 941a. For example, the second transmitting gear 941b may have a smaller number of gear teeth than the first driving gear 941b.

According to an embodiment, the electronic device 400 may further include a transmitting axis 464 connected to the pinion gear 462 and the second axis 940. The transmitting axis 464 may rotate the pinion gear 462 by rotation of the second axis 940. For example, the transmitting axis 464 may penetrate the pinion gear 462. For another example, the transmitting axis 464 may cover the other end of the second axis 940 facing the one end of the second axis 940 facing the motor 461. According to an embodiment, at least a part of the second axis 940 may be movable inside the transmitting axis 464 by the actuator 910. The transmitting axis 464 may include an empty space such that the second axis 940 is movable therein. For example, the second axis 940 may be inserted into the transmitting axis 464 as it moves in the third direction (e.g., the +x direction) by the actuator 910. For another example, the second axis 940 may be pulled out from the transmitting axis 464 as it moves in the fourth direction (e.g., the −x direction) opposite to the third direction by the actuator 910.

According to an embodiment, the transmitting axis 464 may include an accommodating protrusion 464a disposed on the inner surface of the transmitting axis 464 surrounding the second axis 940. The accommodating protrusion may guide the movement of the second axis 940. According to an embodiment, the accommodating protrusion 464a may protruded from the inner surface of the transmitting axis 464 and extended along the inner surface of the transmitting axis 464. For example, the accommodating protrusion 464a may be extended in the third direction along the inner surface of the transmitting axis 464. The length of the accommodating protrusion 464a in the third direction may correspond to the moving range of the actuator 910.

According to an embodiment, the second axis 940 may include an accommodating groove 940a that guides the movement of the second axis 940 along with the accommodating protection 464a. According to an embodiment, the accommodating groove 940a may be disposed on the outer surface of the second axis 940 surrounded by the transmitting axis 464. The accommodating groove 940a may be extended along the outer surface of the second axis 940. For example, the accommodating groove 940a may be extended in the third direction along the outer surface of the second axis 940. The length of the accommodating groove 940a in the third direction may correspond to the moving range of the actuator 910 and the length of the accommodating protection 464a in the third direction. According to an embodiment, the accommodating groove 940a may be relatively movable with respect to the accommodating protection 464a by the actuator 910. For example, as the second axis 940 is moved by the actuator 910, the accommodating groove 940a may be slidable with respect to the accommodating protection 464a.

FIG. 9D illustrates that the accommodating groove 940a is disposed on the second axis 940 and the accommodating protection 464a is disposed on the transmitting axis 464, but it is for the convenience of explanation. According to embodiments, the accommodating groove 940a may be disposed on the transmitting axis 464, and the accommodating protection 464a may be disposed on the second axis 940.

According to an embodiment, when the switching structure 900 is in the gear-connected state (e.g., the first gear-connected state or the second gear-connected state), at least one transmitting gear 941 may be engaged with at least one driving gear 921. For example, when the switching structure 900 is in the first gear-connected state, the second driving gear 921b may be engaged with the second transmitting gear 941b. When the switching structure 900 is in the first gear-connected state, the first driving gear 921a may be spaced apart from the second driving gear 921b. When the switching structure 900 is in the first gear-connected state, the first driving gear 921a and the first driving gear 921b may be in a state in which engagement is released. For another example, when the switching structure 900 is the second gear-connected state having a gear ratio higher than the first gear-connected state, the first driving gear 921a may be engaged with the first transmitting gear 941a. When the switching structure 900 is in the second gear-connected state, the second driving gear 921b may be spaced apart from the second transmitting gear 941b. When the switching structure 900 is in the second gear-connected state, the engagement of the second driving gear 921b and the second transmitting gear 941b may be released.

According to an embodiment, when the switching structure 900 is in the gear-connected state (e.g., the first gear-connected state or the second gear-connected state), the first axis 920 may be rotated by the motor 461. At least one driving gear 921 may rotate at least one transmitting gear 941 engaged with at least one driving gear 921 by rotation of the first axis 920. The second axis 940 may be rotated by rotation of at least one transmitting gear 941. The accommodating groove 940a disposed on the second axis 940 may rotate the accommodating protrusion 464a of the transmitting axis 464 by rotating by the rotation of the second axis 940. The transmitting axis 464 may be rotated by the accommodating protection 464a to rotate the pinion gear 462. As the pinion gear 462 rotates, the rack gear 463 may move with respect to the first housing (e.g., the first housing 410 of FIGS. 4A and 4B) in a first direction (e.g., the +y direction) or a second direction (e.g., the −y direction) opposite to the first direction. The second housing (e.g., the second housing 420 of FIGS. 4A and 4B) may expand or contract the display (e.g., the display 430 of FIGS. 4A, 4B, and 4C) by moving in the direction of movement of the rack gear 463 by the movement of the rack gear 463.

According to an embodiment, when the switching structure 900 is in the gear-released state, engagement of at least one transmitting gear 941 and at least one driving gear 921 may be released. For example, when the switching structure 900 is in the gear-released state, each of the first transmitting gear 941a and the second transmitting gear 941b may be spaced apart from the first driving gear 921a and the second driving gear 921b without being engaged with the first driving gear 921a and the second driving gear 921b. For example, when the switching structure 900 is in the gear-released state, the first transmitting gear 941a and the second transmitting gear 941b may be disposed between the first driving gear 921a and the second driving gear 921b. According to an embodiment, when the switching structure 900 is in the gear-released state, the second axis 940 may be rotatable independently with respect to the first axis 920. When the switching structure 900 is in the gear-released state, the second axis 940 may not be rotated by the motor 461. As the second axis 940 is independently rotatable to the first axis 920, the second housing 420 may be movable with respect to the first housing 410 by manual operation.

According to an embodiment, the state of the switching structure 900 may be changed based on the moving distance and direction of the actuator 910. For example, when the switching structure 900 is in the gear-released state, as the actuator 910 moves by the third designated distance in the third direction (e.g., the +x direction), the switching structure 900 may be changed to the first gear-connected state. For another example, when switching structure 900 is in the gear-released state, as the actuator 910 moves by the fourth designated distance in the fourth direction (e.g., the −x direction), the switching structure 900 may be changed to the second gear-connected state.

According to an embodiment, the processor (e.g., processor 470 of FIG. 4C) may be configured to identify whether the state change of the switching structure 900 is completed based on identifying the moving distance of the actuator 910 after driving the actuator 910. The processor 470 may identify whether the moving distance of the actuator 910 corresponds to the designated distance based on receiving data related to driving of the actuator 910 after driving the actuator 910. For example, the processor 470 may obtain data related to the driving of the actuator 910 through an encoder of the actuator 910, or data related to the driving of the actuator 910 through a phase change of current received in the driving integrated circuit of actuator 910. For example, the processor 470 may drive the actuator 910 based on receiving a signal for changing the state of switching structure 900 from the gear-released state to the first gear-connected state. In order to change the state of switching structure 900 from the gear-released state to the first gear-connected state, the actuator 910 may have to move in the third direction (e.g., the +x direction) by a distance corresponding to the third designated distance. The processor 470 may identify that the state change of the switching structure 900 is incomplete based on identifying that the moving distance of the actuator 910 identified through data related to the driving of the actuator 910 is less than the third designated distance. When the moving distance of the actuator 910 is less than the designated distance, the processor 470 may identify that the at least one driving gear 921 and the at least one transmitting gear 941 are in a misaligned state.

According to an embodiment, the processor 470 may be configured to align at least one transmitting gear 941 and at least one driving gear 921 through the motor 461 so that at least one transmitting gear 941 and at least one driving gear 921 engage with each other based on identifying that the moving distance of actuator 910 is less than the designated distance. For example, the processor 470 may be configured to rotate motor 461 at a designated angle based on identifying that the moving distance of actuator 910 is less than the designated distance. After alignment of at least one driving gear 921 and at least one transmitting gear 941, the processor 470 may retry changing the state of the switching structure 900 through the actuator 910. When the state change of switching structure 900 is re-identified as incomplete, the processor 470 may re-perform an operation of aligning at least one driving gear 921 and at least one transmitting gear 941 through the motor 461.

As described above, according to an embodiment, the electronic device 400 may provide a structure capable of stably expanding or contracting the display 430 in various environments by the switching structure 900 in which the state may be changed by the movement of the actuator 910.

Figure 10:
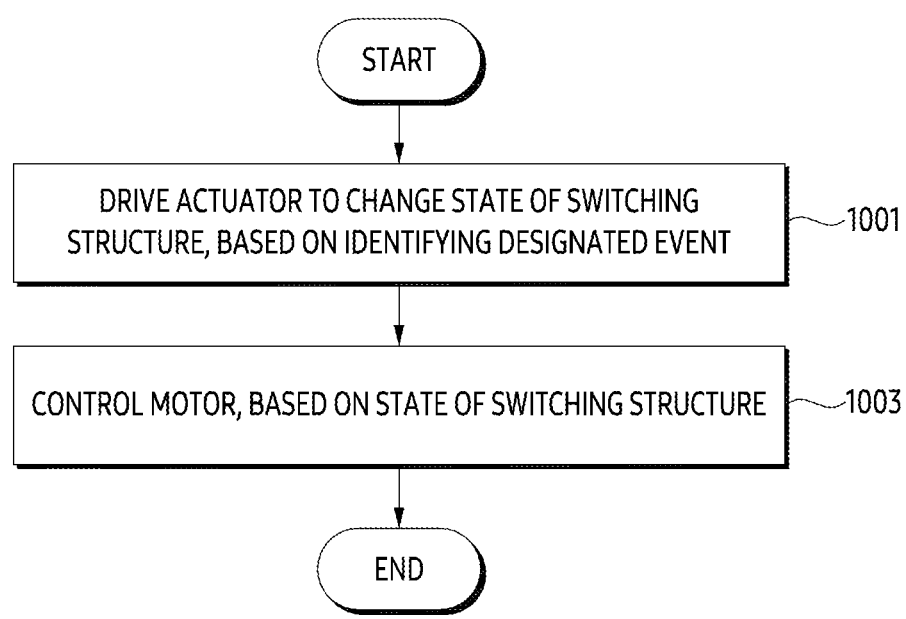
FIG. 10 illustrates an example of an operation of a processor of an electronic device according to an example embodiment.
Figure 11:
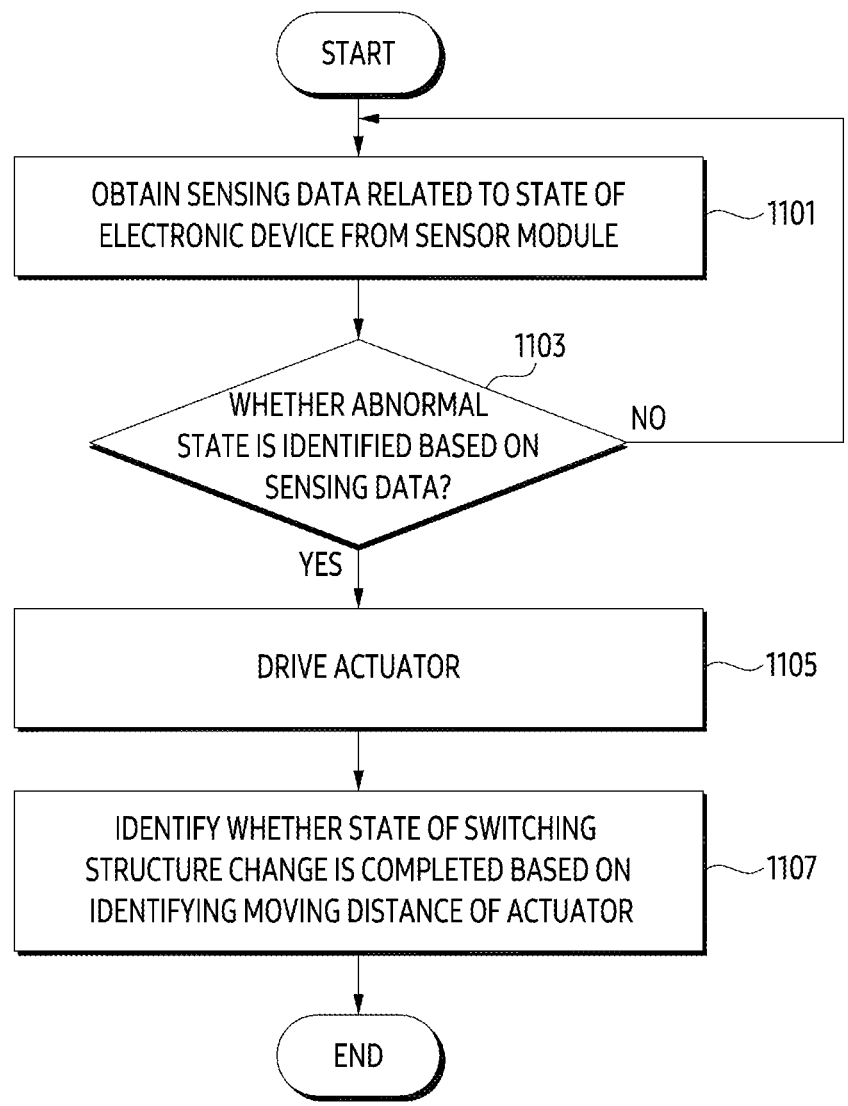
FIG. 11 illustrates an example of an operation of a processor of an electronic device according to an example embodiment.

FIG. 10 illustrates an example of an operation of a processor of an electronic device according to an embodiment, and FIG. 11 illustrates an example of an operation of a processor of an electronic device according to an embodiment.

The operations illustrated in FIGS. 10 and 11 may be performed by the electronic device 400 of FIGS. 4A, 4B, 4C, 6A, 6B, 6C, 7A, 7B, 9A, 9B and/or 9C.

Referring to FIG. 10, in operation 1001, the processor (e.g., the processor 470 of FIG. 4C) may drive the actuator (e.g., the actuator 510 of FIGS. 4A, 4B, and 4C) to change the state of the switching structure (e.g., the switching structure 500 of FIGS. 4a and 4B) based on identifying a designated event. According to an embodiment, the designated event may include a case where a user input for changing the state of switching structure 500 is received or an abnormal state of the electronic device 400 is detected through a sensor module (e.g., the sensor module 480 of FIG. 4C). For example, the processor 120 may obtain sensing data through the sensor module 480. The sensing data may include data related to an acceleration of the electronic device from an acceleration sensor (e.g., the acceleration sensor 481 of FIG. 4C), data related to an angular velocity of the electronic device from a gyro sensor (e.g., the gyro sensor 482 of FIG. 4C), data related to a temperature of the motor (e.g., the motor 461 of FIG. 4C) from a first temperature sensor (e.g., the first sensor 483 of FIG. 4C), and/or data related to a temperature of the display 430 from a second temperature sensor (e.g., the second sensor 484 of FIG. 4C).

According to an embodiment, the processor 120 may identify an abnormal state among the designated events based on sensing data obtained through the sensor module 480. For example, an abnormal state of the electronic device 400 may include a state in which the electronic device 400 falls, a low power state of the electronic device 400, an overheated state of the electronic device 400, and a state in which the electronic device 400 is exposed to a low temperature environment.

According to an embodiment, the processor 470 may change the state of the switching structure 500 through the actuator 510 based on obtaining a signal for changing the state of the switching structure 500. The signal for changing the state of the switching structure may include a signal indicating an abnormal state during the designated event or a signal related to a user input for requesting a state change of the electronic device. For example, the processor 470 may change the switching structure 500 from the gear-connected state (e.g., the first gear-connected state or the second gear-connected state) to the gear-released state. For another example, the processor 470 may change the switching structure 500 from the gear-released state to the gear-connected state. For still another example, the processor 470 may change the switching structure 500 from the first gear-connected state to the second gear-connected state or from the second gear-connected state to the first gear-connected state.

In operation 1003, the processor 470 may control the motor (e.g., the motor 461 of FIGS. 4A, 4B, and 4C) based on the state of the switching structure 500. The processor 470 may identify the changed state of the switching structure 500. For example, the processor 470 may control the motor 461 so that the motor 461 does not operate based on the switching structure 500 identifying the gear-released state. For another example, the processor 470 may drive the motor 461 to move the second housing (e.g., the second housing 420 of FIG. 4A and FIG. 4B) based on identifying that switching structure 500 is the gear-connected state (e.g., the first gear-connected state or the second gear-connected state).

According to an embodiment, the flowchart of FIG. 11 may be a flowchart illustrating operation 1001 of FIG. 10.

Referring to FIG. 11, in operation 1101, the processor 470 may obtain sensing data related to the state of the electronic device 400 from the sensor module 480. For example, the state of the electronic device 400 may include motion (e.g., acceleration or angular velocity) of the electronic device 400 and the temperature of the electronic device 400, but it is not limited thereto.

In operation 1103, the processor 470 may identify whether the electronic device 400 is in an abnormal state based on the sensing data obtained from the sensor module 480. For example, the processor 470 may identify that the electronic device 400 is falling when the acceleration value of the electronic device 400 obtained from the acceleration sensor (481 in FIG. 4C) exceeds the first designated value. For another example, the processor 470 may identify that the electronic device 400 is falling when the angular velocity value of the electronic device 400 obtained from the gyro sensor (e.g., the gyro sensor 482 of FIG. 4C) exceeds the second designated value. For still another example, the processor 470 may identify that the motor 461 is overheated when the temperature obtained by the first temperature sensor 483 for sensing the temperature of the motor 461 exceeds the fourth designated value. For still another example, when the temperature obtained from the second temperature sensor 484 for sensing the temperature of the display 430 is less than the fifth designated value, the processor 470 may identify that the electronic device 400 is exposed to the low temperature environment.

In operation 1105, the processor 470 may drive the actuator 510 to change the state of the switching structure 500 based on identifying the abnormal state of the electronic device 400. For example, the processor 470 may change the switching structure 500 from the gear-connected state to the gear-released state through the actuator 510 based on identifying that the acceleration value of the electronic device 400 obtained from the acceleration sensor 481 exceeds the first designated value. For another example, the processor 470 may change the switching structure 500 from the gear-connected state to the gear-released state through the actuator 510 based on identifying that the angular velocity value of the electronic device 400 obtained from the gyro sensor 482 exceeds the second designated value. For still another example, the processor 470 may be configured to change the switching structure 500 from the first gear-connected state to the second gear-connected state having a gear ratio higher than the first gear-connected state through the actuator 510, based on identifying that the temperature of the motor 461 obtained by the first temperature sensor 483 exceeds the fourth designated value. For still another example, the processor 470 may be configured to change the switching structure 500 from the first gear-connected state to the second gear-connected state based on identifying that the temperature obtained from the second temperature sensor 484 for sensing the temperature of the display 430 is less than the fifth designated value.

In operation 1107, the processor 470 may identify whether the state of the switching structure 500 is changed based on identifying the moving distance of actuator 510 after the operation of actuator 510. The processor 470 may drive the actuator 510 in response to receiving a signal for changing the state of the switching structure 500. The processor 470 may identify whether the moving distance of the actuator 510 corresponds to the designated distance based on receiving data related to driving of the actuator 510 after driving the actuator 510. For example, the processor 470 may obtain data related to the driving of the actuator 510 through an encoder of the actuator 510, or data related to the driving of the actuator 510 through a phase change of the current received in the driving integrated circuit of the actuator 510. The processor 470 may identify the state change of the switching structure 500 as incomplete based on identifying that the moving distance of the actuator 510 identified through data related to the operation of the actuator 510 is less than the designated distance. According to an embodiment, the processor 470 may align the gears (e.g., at least one driving gear 521 and a first connection gear set 542 or driving gear 621, and a first ring gear 641) inside the switching structure 500 through the motor 461, based on identifying that the moving distance of the actuator 510 is less than the designated distance. For example, the processor 470 may be configured to rotate the motor 461 at a designated angle based on identifying that the moving distance of the actuator 510 is less than the designated distance.

As described above, according to an embodiment, the electronic device 400 may provide a structure capable of stably expanding or contracting a display (e.g., the display 430 of FIGS. 4A, 4B, and 4C) in various environments by the switching structure 500 in which the state may be changed by the movement of the actuator 510. The electronic device 400 according to an embodiment may smoothly expand or contract the display 430 in various environments by the processor 470 configured to change the state of switching structure 500 based on identifying the designated event.

According to an embodiment, an electronic device (e.g., the electronic device 400 of FIGS. 4A, 4B, and 4C) may include a first housing (e.g., the first housing 410 of FIGS. 4A and 4B); a second housing (e.g., the second housing 420 of FIGS. 4A and 4B) disposed movably with respect to the first housing; a display (e.g., the display 430 of FIG. 4C) disposed on (e.g., supported by), directly or indirectly, the second housing and sliding into the first housing or sliding out from the first housing by the movement of the second housing; a motor (e.g., the motor 461 of FIGS. 4A and 4B) disposed in the first housing; at least one pinion gear (e.g., pinion gears 462 of FIGS. 4A and 4B) rotatable by receiving driving force from the motor; and a rack gear (e.g., the rack gear 463 of FIGS. 4A and 4B) disposed in the second housing, engaged with the at least one pinion gear and movable by the rotation of the at least one pinion gear. According to an embodiment, the electronic device may include a switching structure (e.g., the switching structure 500 of FIGS. 4A, 4B, and 4C) disposed between the motor and the pinion gear and changeable to a gear-connected state in which the motor and the pinion gear are connected, directly or indirectly, or a gear-released state in which the motor and the pinion gear are disconnected. According to an embodiment, the electronic device may include an actuator (e.g., the actuator 510 of FIGS. 4A, 4B, and 4C) connected, directly or indirectly, to the switching structure and changing a state of the switching structure. According to an embodiment, the electronic device may include a processor (e.g., the processor 470 of FIG. 4C) operatively coupled to the motor and the actuator. According to an embodiment, the processor may be configured to change the switching structure to the gear-connected state or the gear-released state through the actuator based on identifying the designated event. According to an embodiment, the driving force of the motor may be blocked from being transmitted from the motor to the pinion gear in the gear-released state.

According to an embodiment, the electronic device may further include a motion sensor (e.g., an acceleration sensor 481 of FIG. 4C) or a gyro sensor 482 for detecting motion of the electronic device. According to an embodiment, the processor may be configured to change the state of the switching structure from the gear-connected state to the gear-released state, based on identifying that a data obtained from the motion sensor exceeds a designated value.

According to an embodiment, the electronic device may further include a battery (e.g., the battery 450 of FIGS. 4A, 4B, and 4C) for supplying power to the motor, and according to an embodiment, the at least one processor may be configured to change the state of the switching structure from the gear-connected state to the gear-released state, based on identifying that the power of the battery is lower than a designated value.

According to an embodiment, the state of the switching structure may be changeable to a second gear-connected state having higher gear ratio than the first gear-connected state.

According to an embodiment, an electronic device may include a temperature sensor for sensing a temperature of the display, and wherein the at least one processor may be configured to change the state of the switching structure from the first gear-connected state to the second gear-connected state, based on identifying that the temperature obtained from the temperature sensor is less than a designated value.

According to an embodiment, the switching structure may further include a first axis (e.g., the first axis 520 of FIGS. 4A and 4B) to which the at least one driving gear is coupled, and rotatable coupled to the motor. According to an embodiment, the switching structure may further include a cover housing (e.g., the cover housing 530 of FIGS. 4A and 4B) coupled to the actuator and movable in a first direction parallel to the first axis by the actuator. According to an embodiment, the switching structure may include a second axis (e.g., the second axis 540 of FIGS. 5A, 5B, and 5C) coupled to the cover housing to be rotatable with respect to the cover housing, and coupled to a first connection gear set (e.g., the first connection gear set 542 of FIGS. 5A, 5B, and 5C) including a first connection gear (e.g., the first connection gear 542*a* of FIGS. 5A, 5B, and 5C) and a second connection gear (e.g., the second connection gear 542*b* of FIGS. 5A, 5B, and 5C) distinct from the first connection gear, and a second connection gear set (e.g., the second connection gear set 543 of FIGS. 5A, 5B, and 5C) including a third connection gear (e.g., the third connection gear 543*a* of FIGS. 5A, 5B, and 5C) spaced apart from the first direction from the first connection gear set and a fourth connection gear (e.g., the fourth connection gear 543*b* of FIGS. 5A, 5B, and 5C) distinct from the third connection gear. According to an embodiment, the switching structure may include a third axis (e.g., a third axis 550 of FIGS. 5A, 5B, and 5C) coupled to at least one transmitting gear (e.g., at least one transmitting gear 551 of FIGS. 5A, 5B, and 5C)

and coupled to the pinion gear. According to an embodiment, in the switching structure, the first connection gear set may be engaged with the at least one driving gear, and the second connection gear set may be engaged with the at least one transmitting gear within the gear-connected state, and according to an embodiment, in the switching structure, engagement between the first connection gear set and the at least one driving gear may be released, and engagement between the second connection gear set and the at least one transmitting gear may be released within the gear-released state.

According to an embodiment, the state of the switching structure may be changeable to a second gear-connected state having higher gear ratio than the first gear-connected state. According to an embodiment, the at least one driving gear (e.g., the first driving gear 521a of FIG. 5A, 5B, and FIG. 5C) may include a first driving gear disposed on, directly or indirectly, one end of the first axis facing the motor. According to an embodiment, the at least one driving gear may include a second driving gear (e.g., the second driving gear 521b of FIG. 5A, 5B, and FIG. 5C) disposed on, directly or indirectly, the other end of the first axis facing the one end of the first axis and having a gear teeth number greater than the first driving gear. According to an embodiment, the at least one transmitting gear (e.g., the first transmitting gear 551a of FIGS. 5A, 5B, and 5C) may include a first transmitting gear disposed on, directly or indirectly, one end of the third axis facing the second driving gear. According to an embodiment, the at least one transmitting gear may include a second transmitting gear (e.g., a second transmitting gear 551b of FIGS. 5A, 5B, and 5C) disposed on, directly or indirectly, the other end of the third axis facing the one end of the third axis and having a gear teeth number smaller than the first transmitting gear. According to an embodiment, the first gear-connected state, the second connection gear may be engaged with the second driving gear, and the fourth connection gear may be engaged with the second transmitting gear within the first gear-connected state. According to an embodiment, the first connection gear may be engaged with the first driving gear, and the fourth connection gear may be engaged with the first transmitting gear within the second-gear connection state.

According to an embodiment, the at least one of processor may be configured to, in response to receiving a signal for changing the state of the switching structure, drive the actuator. According to an embodiment, the processor may identify whether a moving distance of the actuator corresponds to a designated distance, based on receiving data related to a driving of the actuator. According to an embodiment, the processor may be configured to align the first connection gear set and the at least one driving gear through the motor for an engagement of the first connection gear set and the at least one driving gear, based on identifying the moving distance of the actuator is less than the designated distance.

According to an embodiment, the processor may be configured to rotate the motor at a designated angle based on identifying that the moving distance of the actuator is less than the designated distance.

According to an embodiment, the first connection gear set may include a first magnet (e.g., a first magnet 544 of FIG. 5C) disposed on, directly or indirectly, one surface of the first connection gear or the second connection gear facing the at least one driving gear. According to an embodiment, the at least one driving gear may include a second magnet (e.g., the first magnet 523 of FIG. 5C) for aligning the at least one driving gear with the first connection gear set by facing the first magnet and interacting with the first magnet.

According to an embodiment, the switching structure may include a first gear housing (e.g., the first gear housing 522 of FIGS. 5A, 5B, and 5C) disposed in the first housing and on which the at least one driving gear and the first axis are disposed. According to an embodiment, the switching structure may be disposed between the first gear housing (e.g., the first gear housing 552 of FIGS. 5A, 5B, and 5C) and the pinion gear, and include a second gear housing in which the at least one transmitting gear and the third axis are disposed.

According to an embodiment, one surface of the first gear housing and the second gear housing may face the cover housing and at least a part thereof may be opened toward the cover housing.

According to an embodiment, the cover housing may be movable in a direction toward the motor or toward the pinion gear.

According to an embodiment, the switching structure may include a first axis (e.g., the first axis 620 of FIGS. 6B, and 6C) to which the at least one driving gear (e.g., the driving gear 621 in FIGS. 6B, and 6C) is coupled, and rotatable by the motor, one end of the first axis is coupled to the motor. According to an embodiment, the switching structure may include a second axis (e.g., a second axis 630 of FIGS. 6A, 6B, and 6C) spaced apart from the first axis, coupled to the transmitting gear (e.g., the transmitting gear 631 of FIGS. 6B, and 6C) spaced apart from the driving gear, and penetrating the pinion gear. According to an embodiment, the switching structure may include a first ring gear (e.g., a first ring gear 641 in FIGS. 6B, and 6C), and a second ring gear (e.g., a second ring gear 642 in FIGS. 6B, and 6C) parallel to the first axis, and a cover housing (e.g., the cover housing 640 of FIGS. 6A, 6B, and 6C) movable by the actuator, surrounding at least a part of the first axis and the second axis. According to an embodiment, the first ring gear may be engaged with the driving gear when the gear-connected state is in the gear-connected state, and may be spaced apart from the driving gear when the gear-released state is in the gear-released state. According to an embodiment, the second ring gear may be engaged with the transmitting gear in the gear-connected state, and may be spaced apart from the transmitting gear in the gear-released state.

According to an embodiment, the cover housing may rotate the transmitting gear engaged with second ring gear and second axis, by rotating by the at least one driving gear engaged with the first ring gear, within the gear-connection state. According to an embodiment, the pinion gear may rotate by a rotation of the second axis to move the rack gear.

According to an embodiment, the at least one driving gear may be disposed between the first ring gear and the second ring gear within the gear-released state.

The switching structure may further include a first bearing (e.g., a first bearing 651 of FIG. 6B, and FIG. 6C) surrounding one end of the first axis spaced apart from the motor and one end of the second axis spaced apart from the pinion gear, and disposed in the cover housing.

According to an embodiment, the switching structure may further include a second bearing (e.g., a second bearing 652 of FIGS. 6B, and 6C) disposed between the motor and the first ring gear and supporting the cover housing.

According to an embodiment, the switching structure may further include a third bearing (e.g., a third bearing 653 of FIGS. 6B, and 6C) disposed between the second ring gear and the pinion gear and supporting the cover housing.

According to an embodiment, the cover housing may further include a coupling groove (e.g., a coupling groove

640b of FIGS. 6B, and 6C) formed by recessing at least a part of the outer surface along a periphery of the outer surface of the cover housing. According to an embodiment, a part of the actuator may be accommodated in the coupling groove.

According to an embodiment, the cover housing may be movable in a direction toward the motor or in a direction toward the pinion gear by the actuator. According to an embodiment, the switching structure may be changed from the gear-connected state to the gear-released state when the cover housing moves in a direction toward the motor. According to an embodiment, the switching structure may be changed from the gear-released state to the gear-connected state when the cover housing moves in a direction toward the pinion gear.

According to an embodiment, the processor may drive the actuator in response to receiving a signal for changing the switching structure from the gear-released state to the gear-connected state. According to an embodiment, the processor may identify whether the moving distance of the actuator corresponds to a designated distance based on receiving data related to the driving of the actuator. According to an embodiment, the processor may be configured to align the driving gear and the first ring gear in order to engage the driving gear and the first ring gear through the motor, based on identifying that the moving distance of the actuator is less than the designated distance.

According to an embodiment, the cover housing may further include a first magnet spaced apart from the first ring gear and disposed on an inner surface of the cover housing. According to an embodiment, the first axis may further include a second magnet facing the first magnet and aligning the first ring gear and the driving gear by interacting with the first magnet.

According to an embodiment, the switching structure (e.g., the switching structure 900 of FIGS. 9A, 9B, and 9C) may further include a first axis (e.g., the first axis 920 of FIGS. 9A, 9B, and 9C) in which the at least one driving gear (e.g., at least one driving gear 921 of FIGS. 9A, 9B, and 9C) is coupled, coupled to the motor to be rotatable by the motor. According to an embodiment, the switching structure may further include a cover housing (e.g., the cover housing 930 of FIGS. 9A, 9B, and 9C) coupled to the actuator and movable along a first direction parallel to the first axis by the actuator. According to an embodiment, the switching structure may include a second axis (e.g., a second axis 940 of FIG. 9A, FIG. 9B, and FIG. 9C) rotatably coupled to the cover housing and coupled to at least one transmitting gear (e.g., at least one transmitting gear 941 of FIGS. 9A, 9B, and 9C). According to an embodiment, the at least one transmitting gear may be engaged with the at least one driving gear in the gear-connected state of the switching structure. According to an embodiment, in the gear-released state of the switching structure, engagement of at least one transmitting gear and at least one driving gear may be released.

According to an embodiment, the state of the switching structure may be changeable to a second gear-connected state having higher gear ratio than the first gear-connected state. According to an embodiment, the at least one driving gear may include a first driving gear (e.g., the first driving gear 921a of FIG. 9A, 9B, and FIG. 9C) disposed at one end of the first axis facing the motor. According to an embodiment, the at least one driving gear may include a second driving gear (e.g., the second drive gear 921b of FIGS. 9A, 9B, and 9C) spaced apart from the first driving gear in the first direction and having a gear teeth number different from the first driving gear. According to an embodiment, the at least one transmitting gear may include a first transmitting gear (e.g., the first transmitting gear 941a of FIGS. 9A, 9B, and 9C) disposed at one end of the second axis facing the actuator. According to an embodiment, the at least one transmitting gear may include a second transmitting gear (e.g., the second transmitting gear 941b of FIGS. 9A, 9B, and 9C) spaced apart from the first connection gear in the first direction and having a gear teeth number different from the first transmitting gear. According to an embodiment, in the first gear-connected state of the switching structure, the second driving gear may be engaged with the second transmitting gear. According to an embodiment, in the second gear-connected state of the switching structure, the first driving gear may be engaged with the first transmitting gear.

According to an embodiment, the electronic device may further include a transmitting axis (e.g., the transmitting axis 464 of FIGS. 9A, 9B, and 9C) connected, directly or indirectly, to the pinion gear and the second axis and rotating the pinion gear by rotation of the second axis. According to an embodiment, the second axis may be inserted into the transmitting axis as it moves in the first direction by the actuator, and pulled out from the transmitting axis as it moves in a second direction opposite to the first direction.

According to an embodiment, an electronic device (e.g., the electronic device 400 of FIGS. 4A, 4B, and 4C) may include a first housing (e.g., the first housing 410 of FIGS. 4A and 4B); a second housing (e.g., the first housing 410 of FIGS. 4A and 4B) disposed movably with respect to the first housing; a display (e.g., the display 430 of FIG. 4C) disposed on the second housing and sliding into the first housing or sliding out from the first housing by the movement of the second housing; a motor (e.g., the motor 461 of FIG. 4A and FIG. 4B) disposed in the first housing; a pinion gear disposed in the first housing, rotatable by receiving driving force from the motor; and a rack gear (e.g., rack gear 463 of FIGS. 4A and 4B) disposed in the second housing, engaged with the pinion gear, movable by a rotation of the pinion gear. According to an embodiment, the electronic device may include a switching structure (e.g., switching structure 500 of FIGS. 4A, 4B, and 4C) disposed between the motor and the pinion gear, and changeable to a gear-connected state in which the motor and the pinion gear are connected, directly or indirectly, or a gear-released state in which the motor and the pinion gear are disconnected. According to an embodiment, the electronic device may include an actuator connected to the switching structure and changing a state of the switching structure. According to an embodiment, the switching structure may include a first axis (e.g., the first axis 720 of FIG. 7A and FIG. 7B) in which a driving gear (e.g. driving gear 721 in FIGS. 7A and 7B) is coupled and one end is coupled to a motor to be rotatable by the motor. According to an embodiment, the switching structure may include a second axis (e.g., the second axis 730 of FIG. 7A and FIG. 7B) spaced apart from the first axis, coupled to the transmitting gear (e.g., transmitting gear 731 in FIGS. 7A and 7B) spaced apart from the driving gear, and penetrating the pinion gear. According to an embodiment, the switching structure may include a cover housing (e.g., the cover housing 740 of FIG. 7A and FIG. 7B) including a first ring gear (e.g., a first ring gear 741 of FIGS. 7A and 7B) and a second ring gear (e.g., the first ring gear 742 of FIGS. 7A and 7B) spaced apart from the first ring gear along a direction parallel to the first axis, surrounding at least a part of the first axis and the second axis, and coupled to the actuator to be movable by the actuator. According to an embodiment, the first ring gear may be engaged with the driving gear within the gear-connected state, may be spaced apart from the driving gear within the gear-released state. According to an embodiment, the second ring gear may be engaged with the driving gear within the gear-connected state and the gear-released state.

According to an embodiment, the cover housing may rotate the transmitting gear engaged with second ring gear and second axis, by rotating by the at least one driving gear engaged with the first ring gear, within the gear-connection state. According to an embodiment, the pinion gear may rotate by a rotation of the second axis to move the rack gear.

According to an embodiment, the driving gear may be disposed between the first ring gear and the second ring gear when the gear-released state is in the gear-released state.

According to an embodiment, the switching structure may further include a first bearing (e.g., the first bearing 651 of FIGS. 6A, 6B, and 6C) surrounding one end of the first axis spaced apart from the motor and one end of the second axis spaced apart from the pinion gear, and disposed in the cover housing.

According to an embodiment, the cover housing may further include a coupling groove (e.g., a coupling groove 640b of FIGS. 6A, 6B, and 6C) formed by recessing at least a part of the outer surface along a periphery of the outer surface of the cover housing. According to an embodiment, a part of the actuator may be accommodated in the coupling groove.

According to an embodiment, the cover housing may be movable in a direction toward the motor or in a direction toward the pinion gear by the actuator. According to an embodiment, the switching structure may be changed from the gear-connected state to the gear-released state when the cover housing moves in a direction toward the motor. According to an embodiment, the switching structure may be changed from the gear-released state to the gear-connected state when the cover housing moves in a direction toward the pinion gear.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added. While the disclosure has been illustrated and described with reference to various embodiments, it will be understood that the various embodiments are intended to be illustrative, not limiting. It will further be understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device comprising:
a first housing;
a second housing movable with respect to the first housing;
a display disposed on the second housing and configured to be slidable into the first housing or slidable out from the first housing based on movement of the second housing;
a motor disposed in the first housing;
at least one driving gear configured to be rotatable by the motor and disposed in the first housing;
at least one pinion gear configured to be rotatable by receiving driving force from the at least one driving gear;
a rack gear disposed in the second housing, engaged with the at least one pinion gear and movable based on rotation of the at least one pinion gear;
a switching structure disposed in the first housing, and including a plurality of gears for connecting the at least one driving gear and the at least one pinion gear, and for releasing the connection between the at least one driving gear and the at least one pinion gear;
an actuator configured to change a state of the switching structure;
at least one processor operably coupled to the motor and the actuator; and
wherein the at least one processor is configured to change a state of the switching structure to a gear-connected state in which the at least one driving gear and the at least one pinion gear are connected, or to a gear-released state in which the at least one driving gear and the at least one pinion gear are disconnected.

2. The electronic device of claim 1,
wherein the electronic device further includes a motion sensor for sensing a movement of the electronic device, and
wherein the at least one processor is configured to change the state of the switching structure from the gear-connected state to the gear-released state, based on identifying that a data obtained from the motion sensor exceeds a designated value.

3. The electronic device of claim 1,
wherein the electronic device further includes a battery for supplying power to the motor, and
wherein the at least one processor is configured to change the state of the switching structure from the gear-connected state to the gear-released state, based on identifying that the power of the battery is lower than a designated value.

4. The electronic device of claim 1,
wherein the gear-connected state is a first gear-connected state, and wherein the state of the switching structure is changeable to a second gear-connected state having higher gear ratio than the first gear-connected state.

5. The electronic device of claim 4, further including a temperature sensor for sensing a temperature of the display, and
wherein the at least one processor is configured to change the state of the switching structure from the first gear-connected state to the second gear-connected state, based on identifying that the temperature obtained from the temperature sensor is less than a designated value.

6. The electronic device of claim 1,
wherein the switching structure further includes:
a first axis to which the at least one driving gear is coupled, and rotatable coupled to the motor;
a cover housing coupled to the actuator and movable in a first direction parallel to the first axis by the actuator;
a second axis coupled to the cover housing to be rotatable with respect to the cover housing; and
a third axis coupled to at least one pinion gear;
wherein the plurality of gears includes:
a first connection gear set including a first connection gear and a second connection gear, and coupled to the second axis;
a second connection gear set spaced apart from the first connection gear set along the first direction, including a third connection gear and a fourth connection gear, and coupled to the second axis;
at least one transmitting gear coupled to the third axis;
wherein in the gear-connected state, the first connection gear set is engaged with at least one driving gear, and the second connection gear set is engaged with at least one transmitting gear, and
wherein in the gear-released state, an engagement between the first connection gear set and the at least one driving gear is released, and an engagement between the second connection gear set and the at least one transmitting gear is released.

7. The electronic device of claim 6,
wherein the gear-connected state is a first gear-connected state,
wherein the state of the switching structure is changeable to a second gear-connected state having higher gear ratio than the first gear-connected state,
wherein the at least one driving gear includes:
a first driving gear disposed on one end of the first axis facing the motor; and
a second driving gear disposed on the other end of the first axis facing the one end of the first axis and having a gear teeth number greater than the first driving gear;
wherein the at least one transmitting gear includes:
a first transmitting gear disposed on an one end of the third axis facing the second driving gear; and
a second transmitting gear disposed on the other end of the third axis facing the one end of the third axis and having a gear teeth number smaller than the first transmitting gear;
wherein in the first gear-connected state, the second connection gear is engaged with the second driving gear, and the fourth connection gear is engaged with the second transmitting gear, and
wherein in the second-gear connection state, the first connection gear is engaged with the first driving gear, and the fourth connection gear is engaged with the first transmitting gear.

8. The electronic device of claim 6,
wherein the at least one of processor is configured to:
in response to receiving a signal for changing the state of the switching structure, drive the actuator,
based on receiving data related to a driving of the actuator, identify whether a moving distance of the actuator corresponds to a designated distance, and
based on identifying the moving distance of the actuator is less than the designated distance, align the first connection gear set and the at least one driving gear through the motor for an engagement of the first connection gear set and the at least one driving gear.

9. The electronic device of claim 1,
wherein the switching structure includes:
a first axis to which the at least one driving gear is coupled, and rotatable by the motor, and wherein one end of the first axis is coupled to the motor;
a second axis spaced apart from the first axis and penetrating the pinion gear; and
a cover housing movable by the actuator, surrounding at least a part of the first axis and the second axis;
wherein the plurality of gears includes:
a transmitting gear coupled to the second axis and spaced apart from the at least one driving gear;
a first ring gear disposed in the cover housing; and
a second ring gear disposed in the cover housing, and spaced apart from the first ring gear along a first direction parallel to the first axis;
wherein the first ring gear is engaged with the at least one driving gear in the gear-connected state, and is spaced apart from the at least one driving gear in the gear-released state, and
wherein the second ring gear is engaged with the transmitting gear in the gear-connected state, and is spaced apart from the transmitting gear in the gear-released state.

10. The electronic device of claim 9,
wherein the cover housing is configured to rotate the transmitting gear engaged with second ring gear and second axis, by rotating by the at least one driving gear engaged with the first ring gear, in the gear-connection state, and
wherein the at least one pinion gear is configured to rotate by a rotation of the second axis to move the rack gear.

11. The electronic device of claim 9, wherein the at least one driving gear is disposed between the first ring gear and the second ring gear in the gear-released state.

12. The electronic device of claim 9, wherein the at least one processor is configured to:
in response to receiving a signal for changing the switching structure from the gear release state to the gear connection state, drive the actuator,
based on receiving a data related to a driving of the actuator, identify whether a moving distance of the actuator corresponds to a designated distance, and
based on identifying that the distance of the actuator is shorter than the designated distance, align the at least one driving gear and the first ring gear through the motor for an engagement of the at least one driving gear and the first ring gear.

13. The electronic device of claim 1,
wherein the switching structure further includes:
a first axis to which the at least one driving gear is coupled, coupled to the motor to be rotatable by the motor;
a cover housing coupled to the actuator and movable along a first direction parallel to the first axis by the actuator; and
a second axis coupled to the cover housing to be rotatable with respect to the cover housing,
wherein the plurality of gears includes:
a first transmitting gear disposed on an one end of the second axis facing the actuator; and
a second transmitting gear coupled to the second axis, spaced apart from the first transmitting gear along the first direction, having a gear teeth number different from the first transmitting gear,
wherein in the gear-connected state, at least one of the first transmitting gear and the second transmitting gear is engaged with the at least one driving gear,
wherein in the gear-released state, an engagement between the first transmitting gear and the at least one driving gear and an engagement between the second transmitting gear and the at least one driving gear is released.

14. The electronic device of claim 13,
wherein the gear-connected state is a first gear-connected state,
wherein the state of the switching structure is changeable to a second gear-connected state having higher gear ratio than the first gear-connected state,
wherein the at least one driving gear includes:
a first driving gear disposed on one end of the first axis facing the motor; and
a second driving gear spaced apart from the first driving gear along the first direction, and having a gear teeth number different from the first driving gear,
wherein in the first gear-connected state, the second driving gear is engaged with the second transmitting gear, and
wherein in the second gear-connected state, the first driving gear is engaged with the first transmitting gear.

15. The electronic device of claim 13,
wherein the electronic device further includes a transmitting axis connected to the at least one pinion gear and the second axis, to provide for rotation of the at least one pinion gear by rotation of the second axis,
wherein the second axis is inserted into the transmitting axis as the actuator moves along the first direction, and is pulled out from the transmitting axis as the actuator moves along a second direction opposite to the first direction.

16. An electronic device comprising:
a first housing;
a second housing disposed movable with respect to the first housing;
a display disposed on the second housing and slidable into the first housing or sliding out from the first housing by the movement of the second housing;
a motor disposed in the first housing;
a pinion gear disposed in the first housing, and rotatable by receiving driving force from the motor;
a rack gear disposed in the second housing, engaged with the pinion gear, and movable by a rotation of the pinion gear;
a switching structure disposed between at least the motor and the pinion gear, and changeable between a gear-connected state in which the motor and the pinion gear are connected, and a gear-released state in which the motor and the pinion gear are disconnected; and
an actuator connected to the switching structure and configured to change a state of the switching structure, wherein the switching structure includes:

a first axis to which a driving gear is coupled and rotatable by the motor, one end of the first axis coupled to the motor;

a second axis to which a transmitting gear is coupled, spaced apart from the first axis, and penetrating the pinion gear; and a cover housing including a first ring gear and a second ring gear spaced apart from the first ring gear along a direction parallel to the first axis, surrounding at least a part of the first axis and the second axis, and coupled to the actuator to be movable by the actuator;

wherein the first ring gear is engaged with the driving gear in the gear-connected state, is spaced apart from the driving gear in the gear-released state, wherein the second ring gear is engaged with the driving gear in the gear-connected state and the gear-released state.

17. The electronic device of claim 16, wherein the cover housing is configured to rotate the transmitting gear engaged with second ring gear and second axis, by rotating by the at least one driving gear engaged with the first ring gear, in the gear-connection state, and wherein the pinion gear is configured to rotate by a rotation of the second axis to move the rack gear.

18. The electronic device of claim 16, wherein the driving gear is disposed between the first ring gear and the second ring gear in the gear-released state.

19. The electronic device of claim 16, wherein the switching structure further includes: a first bearing covering the other end of the first axis spaced apart from the motor and one end of the second axis spaced apart from the pinion gear, and disposed in the cover housing.

20. The electronic device of claim 16, wherein the cover housing is movable in a direction toward the motor or a direction toward the pinion gear by the actuator, and wherein the state of the switching structure is configured to change from the gear-connected state to the gear-released state, based on the cover housing moving in the direction toward the motor, and to change from the gear-released state to the gear connected state, based on the cover housing moving in the direction toward the pinion gear.

* * * * *